United States Patent
Burberry et al.

(10) Patent No.: US 9,304,636 B2
(45) Date of Patent: Apr. 5, 2016

(54) MICRO-WIRE TOUCH SCREEN WITH UNPATTERNED CONDUCTIVE LAYER

(71) Applicants: Mitchell Stewart Burberry, Webster, NY (US); Ronald Steven Cok, Rochester, NY (US); Roger G. Markham, Webster, NY (US)

(72) Inventors: Mitchell Stewart Burberry, Webster, NY (US); Ronald Steven Cok, Rochester, NY (US); Roger G. Markham, Webster, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 102 days.

(21) Appl. No.: 14/032,213

(22) Filed: Sep. 20, 2013

(65) Prior Publication Data

US 2015/0084907 A1    Mar. 26, 2015

(51) Int. Cl.

| G06F 3/044 | (2006.01) |
|---|---|
| G06F 3/046 | (2006.01) |
| G06F 1/16 | (2006.01) |
| G06F 3/041 | (2006.01) |
| G06F 3/042 | (2006.01) |
| H05K 1/02 | (2006.01) |
| G06F 3/047 | (2006.01) |

(52) U.S. Cl.
CPC *G06F 3/044* (2013.01); *G06F 1/16* (2013.01); *G06F 3/042* (2013.01); *G06F 3/046* (2013.01); *G06F 3/047* (2013.01); *G06F 3/0412* (2013.01); *G06F 3/0416* (2013.01); *H05K 1/0216* (2013.01); *H05K 1/0296* (2013.01); *G06F 2203/04103* (2013.01); *G06F 2203/04107* (2013.01); *G06F 2203/04111* (2013.01); *G06F 2203/04112* (2013.01); *H05K 2201/10204* (2013.01); *Y10T 29/49105* (2015.01); *Y10T 29/49117* (2015.01)

(58) Field of Classification Search
CPC ............... G06F 3/044; G06F 2203/04112
USPC ............ 345/173, 174; 178/18.01–18.09
See application file for complete search history.

(56) References Cited

U.S. PATENT DOCUMENTS

| 7,920,129 | B2 | 4/2011 | Hotelling et al. |
|---|---|---|---|
| 8,179,381 | B2 | 5/2012 | Frey et al. |
| 8,279,187 | B2 | 10/2012 | Geaghan |
| 2005/0126831 | A1* | 6/2005 | Richter et al. ............. 178/18.01 |
| 2010/0026664 | A1* | 2/2010 | Geaghan ..................... 345/174 |
| 2010/0328248 | A1 | 12/2010 | Mozdzyn |
| 2011/0007011 | A1 | 1/2011 | Mozdzyn |
| 2011/0099805 | A1* | 5/2011 | Lee ................................ 29/846 |
| 2013/0120287 | A1 | 5/2013 | Oh et al. |
| 2014/0152621 | A1 | 6/2014 | Okayama |

FOREIGN PATENT DOCUMENTS

CN    102063951    5/2011

* cited by examiner

*Primary Examiner* — Shaheda Abdin
(74) *Attorney, Agent, or Firm* — Raymond L. Owens; Kevin E. Spaulding

(57) ABSTRACT

A touch-screen device is disclosed having a touch-sensitive area that includes a plurality of patterned driver electrodes, each having a plurality of patterned conductive electrically connected driver micro-wires. An unpatterned conductive layer that is unpatterned in the touch-sensitive area is in electrical contact with the driver micro-wires of the driver electrodes. A plurality of patterned sensor electrodes each includes a plurality of patterned conductive electrically connected sensor micro-wires. A dielectric layer is located between the driver electrodes and the sensor electrodes.

18 Claims, 19 Drawing Sheets

MICRO-WIRE TOUCH SCREEN WITH UNPATTERNED CONDUCTIVE LAYER

FIELD OF THE INVENTION

The present invention relates to touch screens having micro-wire electrodes and an unpatterned transparent conductor layer.

BACKGROUND OF THE INVENTION

Transparent conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. For example, the use of transparent conductive oxides to form arrays of touch sensors on one side of a substrate is taught in U.S. Patent Application Publication No. 2011/0099805 entitled "Method of Fabricating Capacitive Touch-Screen Panel".

Transparent conductive metal oxides are increasingly expensive and relatively costly to deposit and pattern. Moreover, the substrate materials are limited by the electrode material deposition process (such as sputtering) and the current-carrying capacity of such electrodes is limited, thereby limiting the amount of power that is supplied to the pixel elements and the size of touch screens that employ such electrodes. Although thicker layers of metal oxides or metals increase conductivity, they also reduce the transparency of the electrodes.

Transparent electrodes including very fine patterns of conductive elements, such as metal wires or conductive traces are known. For example, U.S. Patent Application Publication No. 2011/0007011 teaches a capacitive touch screen with a mesh electrode, as do U.S. Patent Application Publication No. 2010/0026664, U.S. Patent Application Publication No. 2010/0328248, and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between 0.5μ and 4μ wide and a transparency of between approximately 86% and 96%.

Conductive micro-wires are formed in micro-channels embossed in a substrate, for example as taught in CN102063951, which is hereby incorporated by reference in its entirety. As discussed in CN102063951, a pattern of micro-channels are formed in a substrate using an embossing technique. Embossing methods are generally known in the prior art and typically include coating a curable liquid, such as a polymer, onto a rigid substrate. A pattern of micro-channels is embossed (impressed) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (such as photosensitive resist) is removed, followed by electro-deposition of metallic ions in a bath.

Capacitive touch screen devices are constructed by locating electrodes on either side of a dielectric layer. Referring to FIG. 18, a prior-art display and touch-screen apparatus 100 includes a display 110 with a corresponding touch screen 120 mounted with the display 110 so that information displayed on the display 110 can be viewed through the touch screen 120. Graphic elements displayed on the display 110 are selected, indicated, or manipulated by touching a corresponding location on the touch screen 120. The touch screen 120 includes a first transparent substrate 122 with first transparent electrodes 130 formed in the x dimension on the first transparent substrate 122 and a second transparent substrate 126 with second transparent electrodes 132 formed in the y dimension facing the x-dimension first transparent electrodes 130 on the second transparent substrate 126. A dielectric layer 124 is located between the first and second transparent substrates 122, 126 and first and second transparent electrodes 130, 132. Touch pad areas 128 are formed by the overlap of the first transparent electrodes 130 and the second transparent electrodes 132. When a voltage is applied across the first and second transparent electrodes 130, 132, electric fields are formed between that are measurable to detect changes in capacitance due to the presence of a touch element, such as a finger or stylus.

A display controller 142 connected through electrical buss connections 136 controls the display 110 in cooperation with a touch-screen controller 140. The touch-screen controller 140 is connected through electrical buss connections 136 and wires 134 and controls the touch screen 120. The touch-screen controller 140 detects touches on the touch screen 120 by sequentially electrically energizing and testing the x-dimension first and y-dimension second transparent electrodes 130, 132.

Referring to FIG. 19, in another prior-art embodiment, the rectangular first and second transparent electrodes 130, 132 that include micro-wires 150 are arranged orthogonally in a micro-pattern 156 on first and second transparent substrates 122, 126 with intervening dielectric layer 124, forming touch screen 120 which, in combination with the display 110 forms the touch screen 120 and display apparatus 100 (FIG. 18).

As is known in the prior art, electromagnetic interference from the display 110 can interfere with the operation of the touch-screen 120. This problem can be ameliorated by providing a ground plane between the touch screen 120 and display 110. However, such a structure undesirably increases the thickness and decreases the transparency of the display and touch screen apparatus 100.

Alternatively, it has been recognized that shielding can be achieved by controlling the relative width of the driver and sense electrodes. For example U.S. Pat. No. 7,920,129 discloses a multi-touch capacitive touch-sensor panel created using a substrate with column and row traces formed on either side of the substrate. To shield the column (sense) traces from the effects of capacitive coupling from a modulated $V_{com}$ layer in an adjacent liquid crystal display (LCD) or any source of capacitive coupling, the row traces were widened to shield the column traces, and the row (driver) traces were placed closer to the LCD. In particular, the rows can be widened so that there is spacing of about 30 microns between adjacent row traces. In this manner, the row traces can serve the dual functions of driving the touch sensor panel, and also the function of shielding the more sensitive column (sense) traces from the effects of capacitive coupling.

Shielding has also been achieved by using metal micro-wire sensor electrodes in combination with transparent conductive driver electrodes. For example U.S. Pat. No. 8,279,187 discloses a multi-layer touch panel having an upper electrode layer having a plurality of composite electrodes including a plurality of metal or metal alloy micro-wire conductors having a cross-sectional dimension of less than 10 microns, a lower electrode layer having a plurality of (patterned) indium oxide-based electrodes, the upper electrodes and lower electrodes defining an electrode matrix having nodes where the upper and lower electrodes cross over. The upper electrode layer is disposed between the first layer and the lower electrode layer and a dielectric layer is disposed between the upper electrode layer and the lower electrode layer. As noted above, it is difficult, expensive, or impossible to meet conductivity requirements for larger touch-screens using patterned indium tin oxide electrodes.

SUMMARY OF THE INVENTION

There is a need, therefore, for further improvements in the structure of a display and touch-screen apparatus that improves sensitivity and efficiency and reduces susceptibility to electromagnetic interference.

In accordance with the present invention, a touch-screen device having a touch-sensitive area, comprises:

a plurality of patterned driver electrodes, each driver electrode including a plurality of patterned conductive electrically connected driver micro-wires;

a conductive layer that is unpatterned in the touch-sensitive area, the conductive layer in electrical contact with the driver micro-wires of the driver electrodes;

a plurality of patterned sensor electrodes, each sensor electrode including a plurality of patterned conductive electrically connected sensor micro-wires; and a dielectric layer located between the driver electrodes and the sensor electrodes.

The present invention provides a touch screen device with improved sensitivity, efficiency, consistency, and reduced susceptibility to electromagnetic interference. The presence of an unpatterned conductive layer electrically connected to the driver electrodes and driver micro-wires provides electromagnetic shielding to the driver and sensor electrodes, thereby reducing electromagnetic interference. The integrated unpatterned conductive layer therefore reduces device thickness by reducing the number of insulating layers. This has the additional benefit of reducing conductive layer thickness and improving transparency in comparison to a conventional shielding system.

The presence of the unpatterned conductive layer also increases capacitance between the driver and sensor electrodes, thereby reducing the voltage needed to sense changes in the capacitive field, for example due to touches, thereby improving efficiency.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein.

The Figures are not drawn to scale since the variation in size of various elements in the Figures is too great to permit depiction to scale.

DETAILED DESCRIPTION OF THE INVENTION

The present invention provides a touch-screen device useful in combination with a display that reduces the effects of electromagnetic interference and improves touch-response sensitivity, efficiency, and consistency over the extent of the touch screen.

Figure 1:
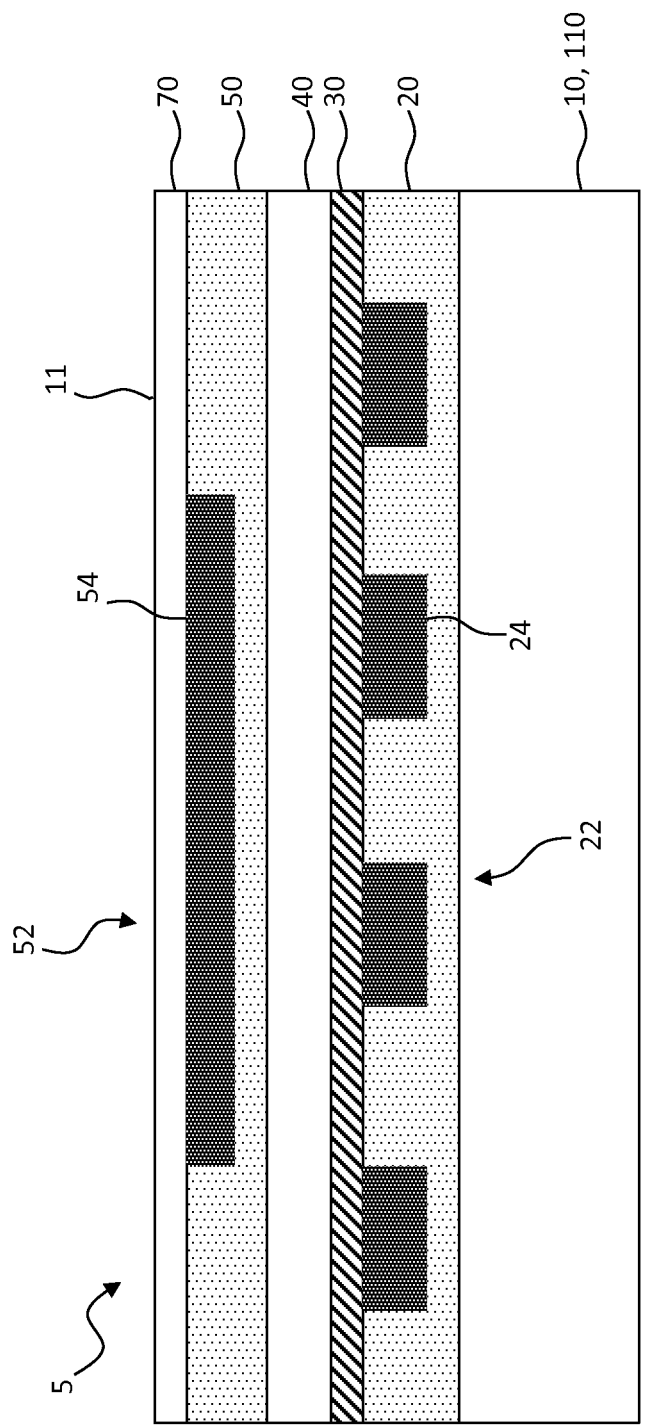
FIGS. 1-12 are cross sectional views of various embodiments of the present invention having a corresponding variety of layer arrangements.
Figure 13:
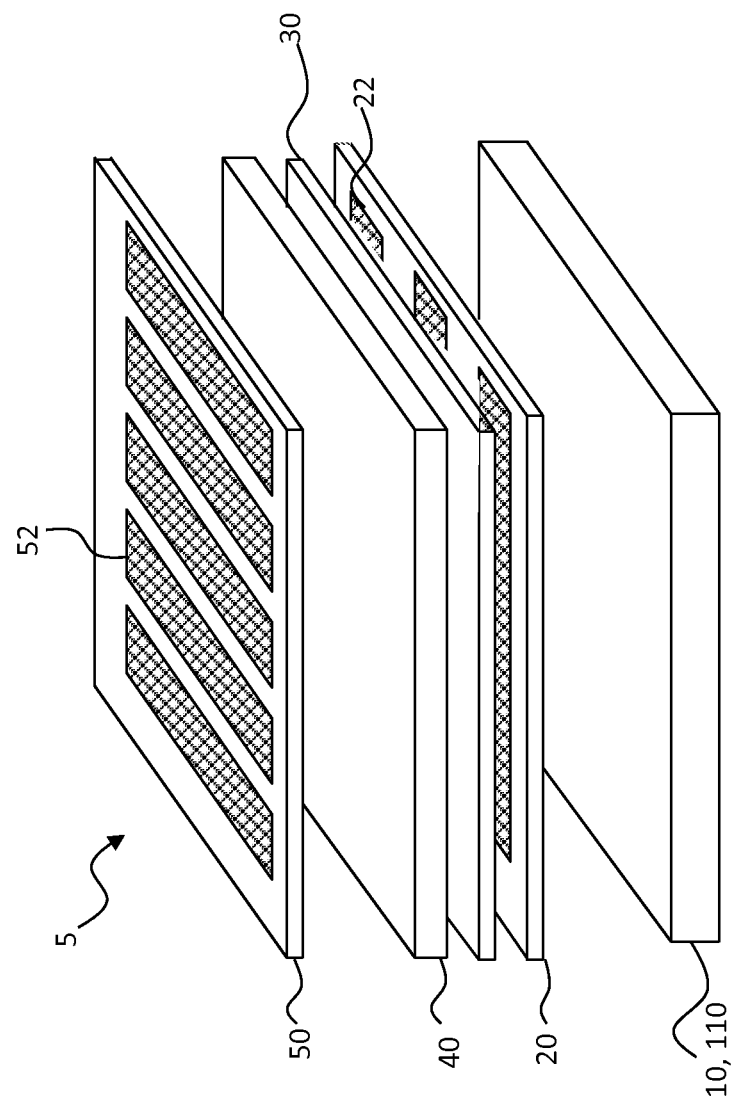
FIG. 13 is a perspective of an embodiment of the present invention corresponding to FIG. 1.
Figure 14:
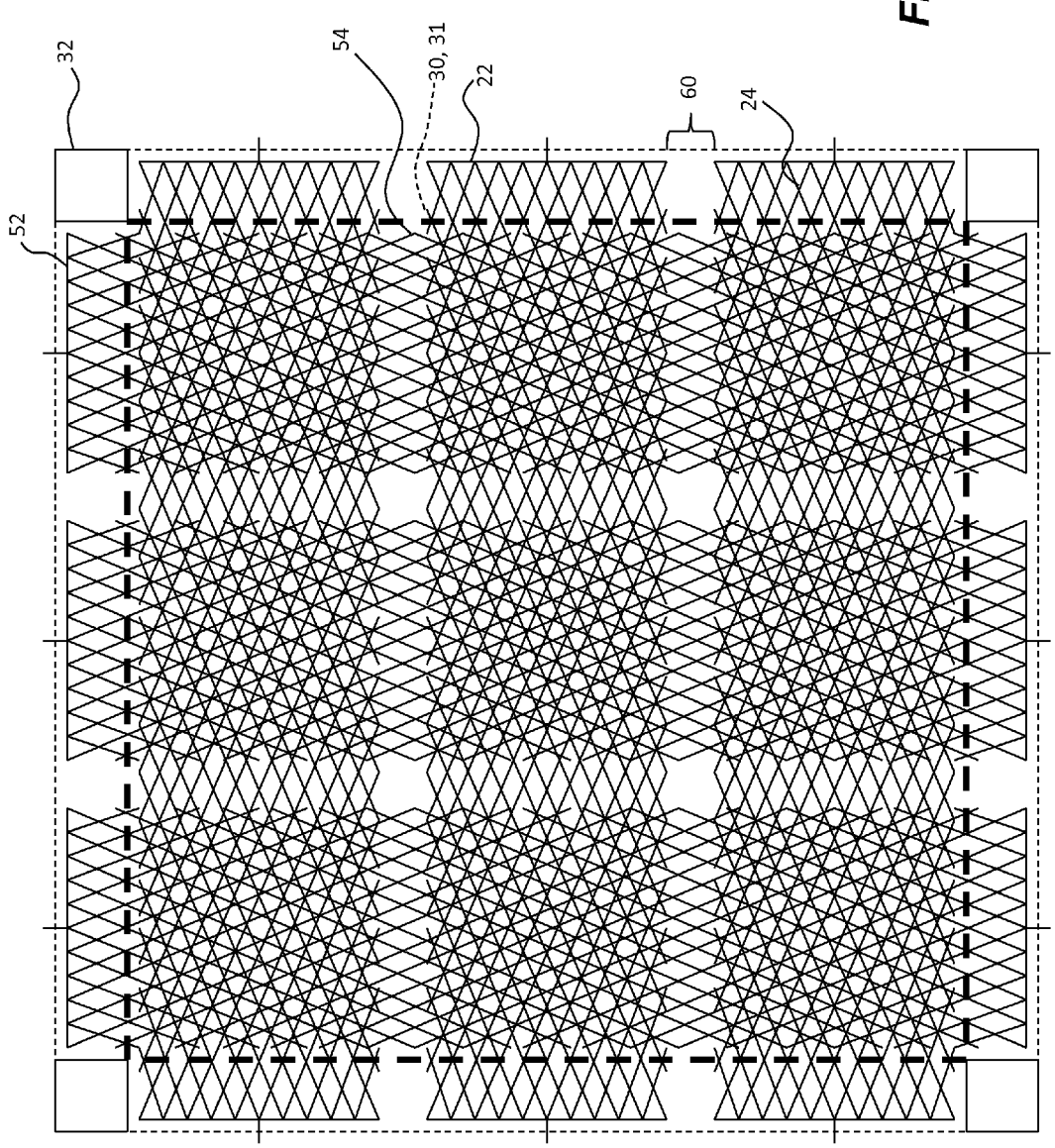
FIG. 14 is a plan view of micro-wire electrodes and a conductive layer useful in an embodiment of the present invention.

Referring to FIG. 1 in cross section, to FIG. 13 in perspective, and to FIG. 14 in plan view in an embodiment of the present invention, a touch-screen device 5 includes a plurality of patterned driver electrodes 22 in a touch-sensitive area 31, each driver electrode 22 including a plurality of patterned conductive electrically connected driver micro-wires 24. An unpatterned conductive layer 30 that is unpatterned in the touch-sensitive area 31 is in electrical contact with the driver electrodes 22. A plurality of patterned sensor electrodes 52 in the touch-sensitive area 31, each sensor electrode 52 including a plurality of patterned conductive electrically connected sensor micro-wires 54 is located on a side of a dielectric layer 40 opposite the driver electrodes 22 so that the dielectric layer 40 is located between the driver electrodes 22 and the sensor electrodes 52 and electrically insulates the driver micro-wires 24 from the sensor electrodes 52. An optional overcoat layer 70 on the sensor electrodes 52 protects the sensor electrodes 52 from the environment, and in particular from touches by a finger or a stylus. FIG. 1 illustrates a cross section through a single driver electrode 22 and along a single sensor micro-wire 54 of the sensor electrode 52.

As used herein, the unpatterned conductive layer 30 refers to the touch-sensitive portion of a conductive-material layer 32 that forms a touch-sensitive area 31. The conductive-material layer 32 is a layer of electrically conductive material that can be patterned, for example around the periphery of a touch screen (such as in the bezel or buss areas of the touch screen), but is unpatterned within the touch-sensitive area 31, for example as illustrated in FIG. 14. The touch-sensitive area 31 is the same portion of the conductive-material layer 32 as the unpatterned conductive layer 30. In an embodiment, the entire conductive-material layer 32 is unpatterned. In electrical contact means that there is no insulating layer between the driver micro-wires 24 of the driver electrodes 22 and the unpatterned conductive layer 30.

As is illustrated further in the embodiment of FIGS. 1 and 13, the driver electrodes 22, the unpatterned conductive layer 30, the dielectric layer 40, and the sensor electrodes 52 are formed on a substrate 10 that can also serve as an element of the display 110, for example a display cover or substrate. Driver electrodes 22 are formed in a driver layer 20 and sensor electrodes 52 are formed in a sensor layer 50. Such driver and sensor layers 20, 50 can, for example, include polymers such as curable polymers that are cured in various ways, such as by exposure to ultra-violet radiation or heat.

According to various embodiments of the present invention, FIGS. 2-12 illustrate touch-screen devices having various arrangements of the substrate 10, driver layer 20, unpatterned conductive layer 30, dielectric layer 40, and sensor layer 50. Separate driver layers 20 or sensor layers 50 are included in some embodiments and not in other embodiments. Driver micro-wires 24 and sensor micro-wires 54 are formed in or on the various layers using a variety of construction methods. An overcoat layer 70 can optionally be provided on layers formed on either side of the substrate 10.

Figure 5:
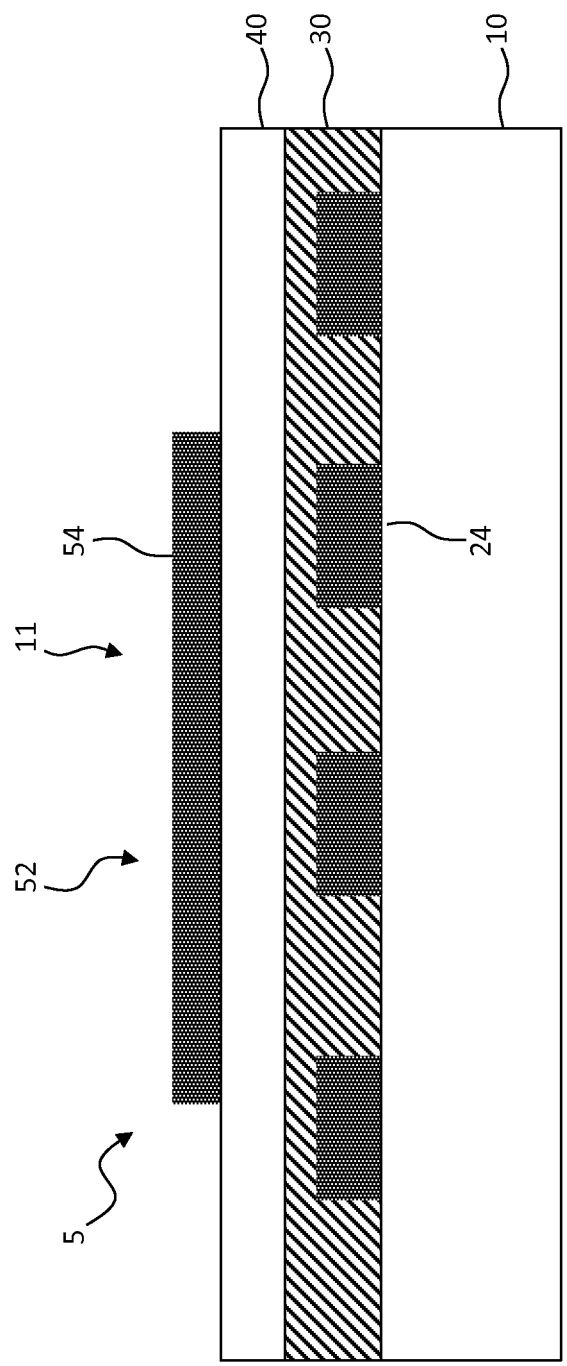
Figure 6:
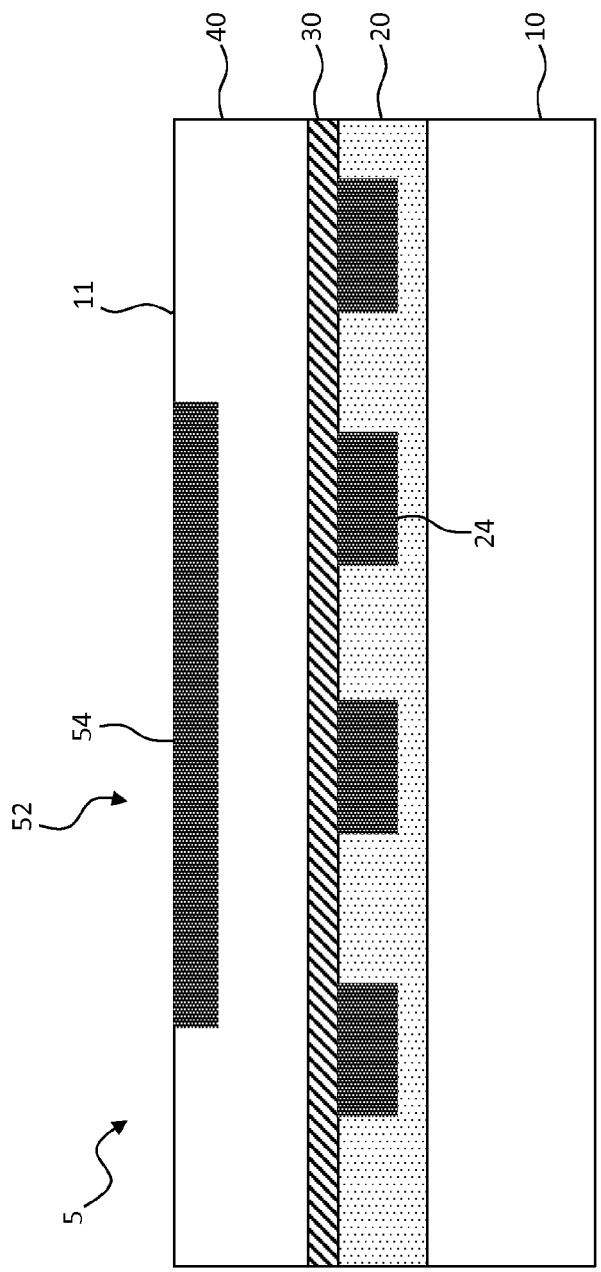
Figure 7:
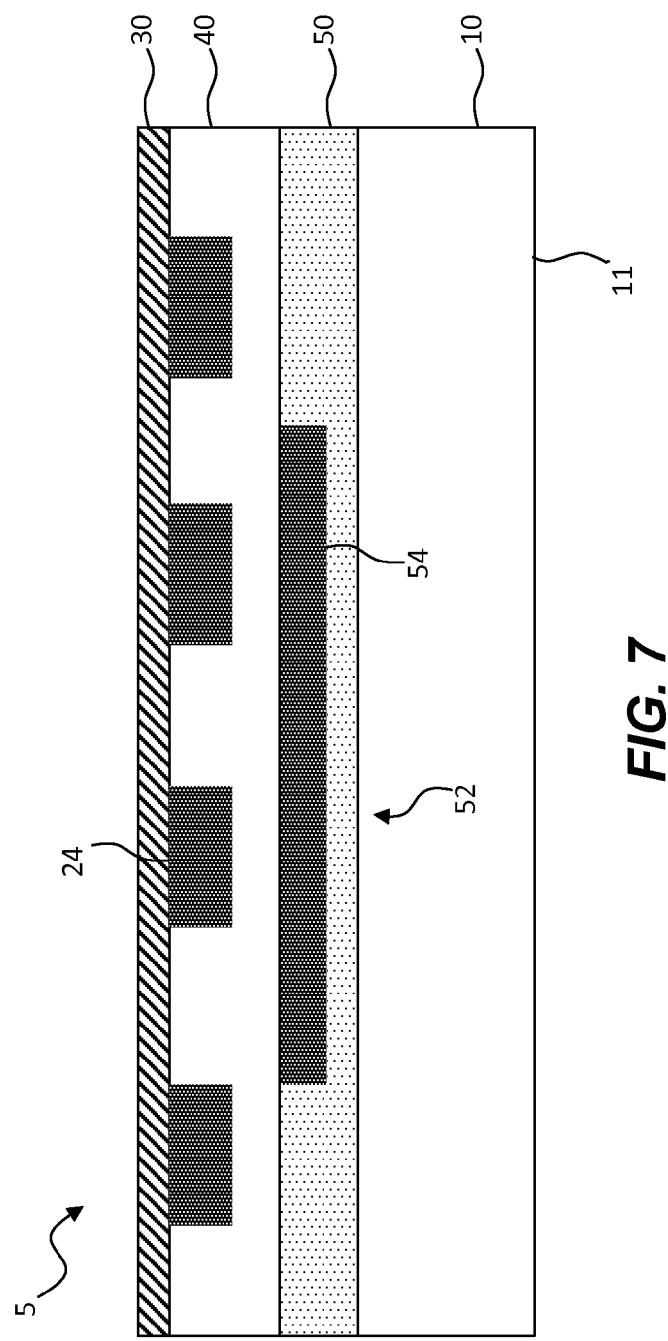
Figure 8:
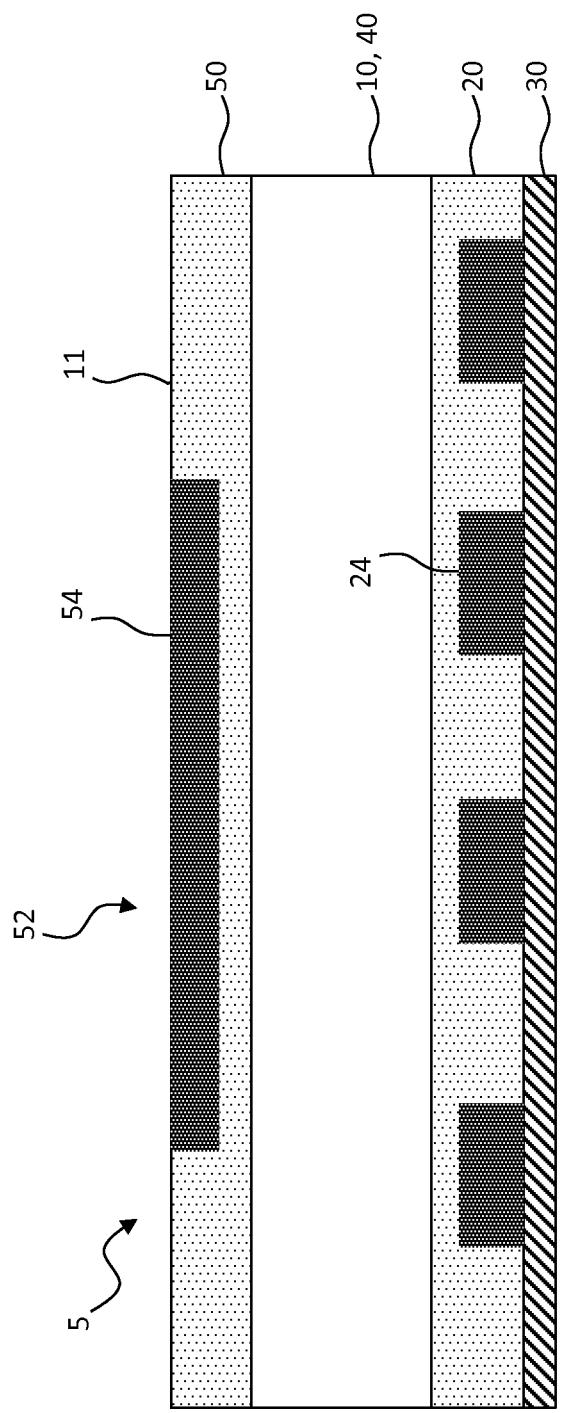
Figure 9:
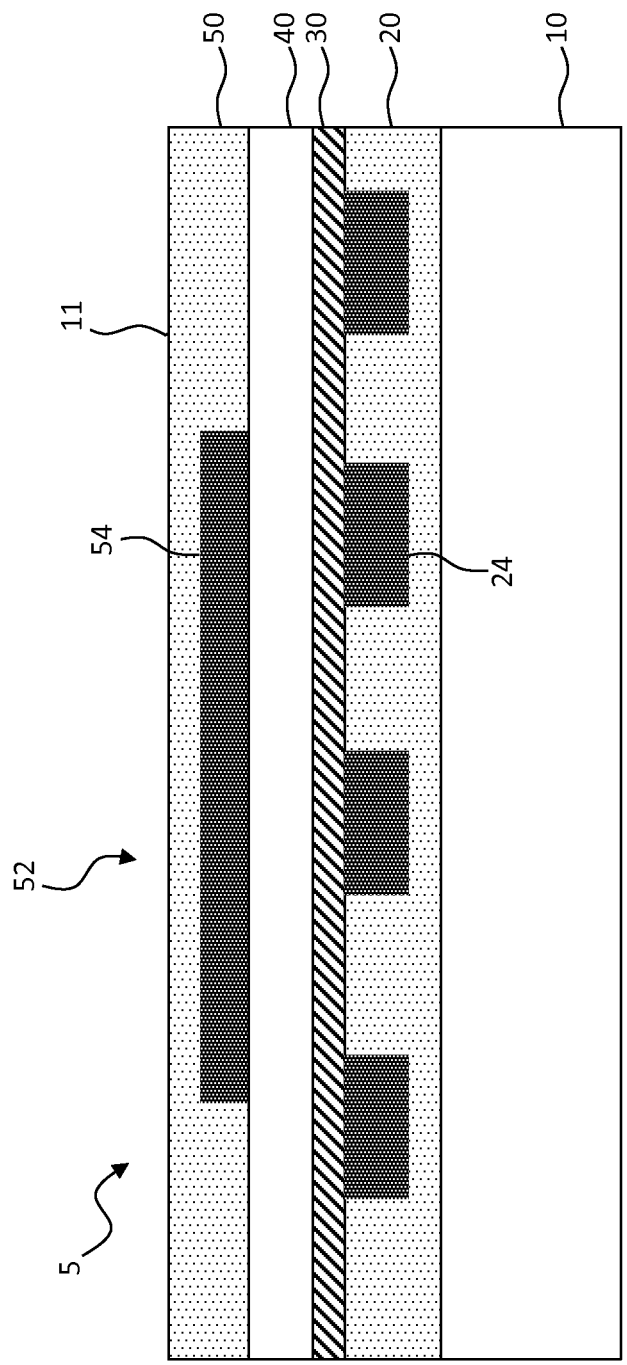

In the embodiment of FIGS. 1, 6, and 9, the unpatterned conductive layer 30 is between the driver electrodes 22 and the dielectric layer 40. The driver micro-wires 24 are formed in a separate drive layer 20. Referring to FIGS. 2, 4, 7, 8, 10, and 12 in an alternative arrangement according to an embodiment of the present invention, the unpatterned conductive layer 30 is not between the driver electrodes 22 and the dielectric layer 40 but is rather on a side of the driver electrodes 22 opposite the dielectric layer 40 or the sensor electrodes 52 so that the driver electrodes 22 are between the unpatterned conductive layer 30 and the dielectric layer 40 or the sensor electrodes 52. The driver micro-wires 24 are formed in the dielectric layer 40. In yet another embodiment illustrated in FIGS. 3 and 5, the driver electrodes 22 are formed in the unpatterned conductive layer 30, so that the unpatterned conductive layer 30 serves as the driver layer 20 supporting the driver electrodes 22. In all three sets of arrangements, the sensor micro-wires 54 are formed in the separate sensor layer 50.

Figure 10:
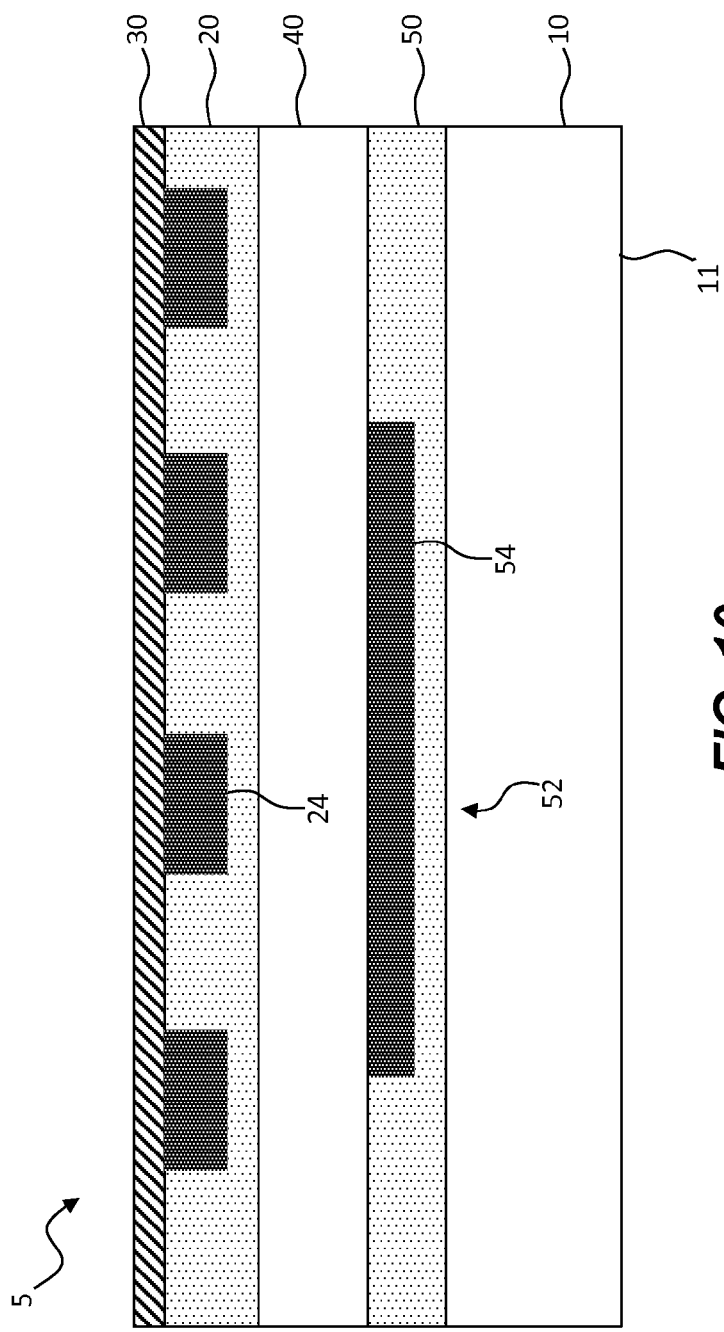

In various embodiments of the present invention, the driver electrodes 22 are adjacent to the substrate 10, as shown in FIGS. 1-6, 9, 11, and 13. By adjacent is meant that no other electrodes are between the driver electrodes 22 and the substrate 10. The driver electrodes 22 are therefore located between the substrate 10 and the dielectric layer 40. As illustrated in FIGS. 7, 10, and 12 in another embodiment, the sensor electrodes 52 are adjacent to the substrate 10 so that no other electrodes are between the sensor electrodes 52 and the substrate 10. The sensor electrodes 52 are therefore located between the substrate 10 and the dielectric layer 40. In FIG. 10, the driver micro-wires 24 are formed in the separate driver layer 20 and the sensor micro-wires 54 are formed in a separate sensor layer 50. The unpatterned conductive layer 30 is located on a side of the driver electrodes 22 opposite the dielectric layer 40. In FIG. 7, the driver micro-wires 24 are formed in the dielectric layer 40 and the sensor micro-wires 54 are formed in the separate sensor layer 50. The unpatterned conductive layer 30 is located on the dielectric layer 40 on a side of the dielectric layer 40 opposite the sensor electrodes 52.

In an embodiment illustrated in FIG. 8, the driver electrodes 22 and the sensor electrodes 52 are on opposite sides of the substrate 10 so that the substrate 10 also serves as the dielectric layer 40. In this embodiment, as in the embodiment of FIG. 10, the driver micro-wires 24 are formed in a separate driver layer 20 and the sensor micro-wires 54 are formed in a separate sensor layer 50. The unpatterned conductive layer 30 is location on a side of the driver electrodes 22 opposite the dielectric layer 40 (substrate 10).

In the embodiment of FIG. 12, the driver micro-wires 24 and the sensor micro-wires 54 are embedded in opposite sides of the dielectric layer 40 formed on the substrate 10 adjacent to the sensor micro-wires 54. The unpatterned conductive layer 30 is on a side of the driver micro-wires 24 opposite the dielectric layer 40.

Not all possible combinations and arrangements of layers are illustrated herein. Other arrangements that provide patterned micro-wire driver electrodes electrically connected to an unpatterned conductor on a side of a dielectric layer opposite patterned micro-wire sensor electrodes are included within the present invention. In particular: either the driver electrodes 22 or the sensor electrodes 52 can be independently arranged adjacent to the substrate 10; the unpatterned conductive layer 30 is located between the driver electrodes 22 and the dielectric layer 40, the driver electrodes 22 are located between the conductive layer and the dielectric layer 40, or the driver electrodes 22 are located at least partially in the unpatterned conductive layer 30; the driver micro-wires 24 are formed in a separate driver layer 20, in the dielectric layer 40, or in the unpatterned conductive layer 30; or the sensor electrodes 52 are located in a separate sensor layer 50 or in the dielectric layer 40. Various arrangements of each of these layers can be combined with other layer arrangements. In general, the touch surface of the touch-screen device is adjacent to the sensor electrode 52. For example, in FIGS. 7, 10, and 12 a touch surface 11 is a side of the substrate 10. In the embodiments of FIGS. 1-6, the touch surface 11 is opposite the substrate 10 rather than a substrate side.

There are at least three methods of providing the driver micro-wires 24 and sensor micro-wires 54. In one method, the driver layer 20 or sensor layer 50 is first formed and then the driver or sensor micro-wires 24, 54, respectively, are formed in micro-channels imprinted in the driver layer 20 or sensor layer 50 to embed the driver or sensor micro-wires 24, 54 in the provided layer. In the Figures, the driver or sensor micro-wires 24, 54 are formed in micro-channels and are illustrated as filling the micro-channels. Thus, the micro-channels are not distinguished from the micro-wires in the illustrations. In a second method, the driver or sensor micro-wires 24, 54 are first formed, for example by printing or transfer onto the surface of substrate 10, and then any subsequent driver layer 20 or sensor layer 50 is coated, deposited, or otherwise provided over the driver or sensor micro-wires 24, 54 to embed the driver or sensor micro-wires 24, 54 in the provided layer. In a third method, a pre-made layer (for example using either of the first or second method) is laminated onto an underlying layer, for example the surface of substrate 10. The pre-made layer can be, for example, either of the sensor layer 50 with sensor micro-wires 54 or the driver layer 20 with driver micro-wires 24.

As shown in FIGS. 1, 6, and 8-10, in the first method the driver layer 20 is provided, for example as a curable driver layer 20 that is then imprinted with an imprinting stamp to form driver micro-channels that are then filled with conductive ink and cured to form the driver micro-wires 24 in the driver micro-channels in the driver layer 20. As shown in FIG. 3, the unpatterned conductive layer 30, rather than a separate driver layer 20, is imprinted with driver micro-channels and having cured driver micro-wires 24. In the embodiment of FIG. 12, the driver micro-wires are formed in imprinted driver micro-channels in the dielectric layer 40. Similarly, the sensor micro-wires 54 are formed in sensor micro-channels formed in the sensor layer 50, as shown in the embodiments of FIGS. 1-4, 7, 8, 10, and 11. In FIG. 6, sensor micro-channels are imprinted in the dielectric layer 40 rather than a separate sensor layer 50 and sensor micro-wires 54 are formed in the sensor micro-channels.

Figure 11:
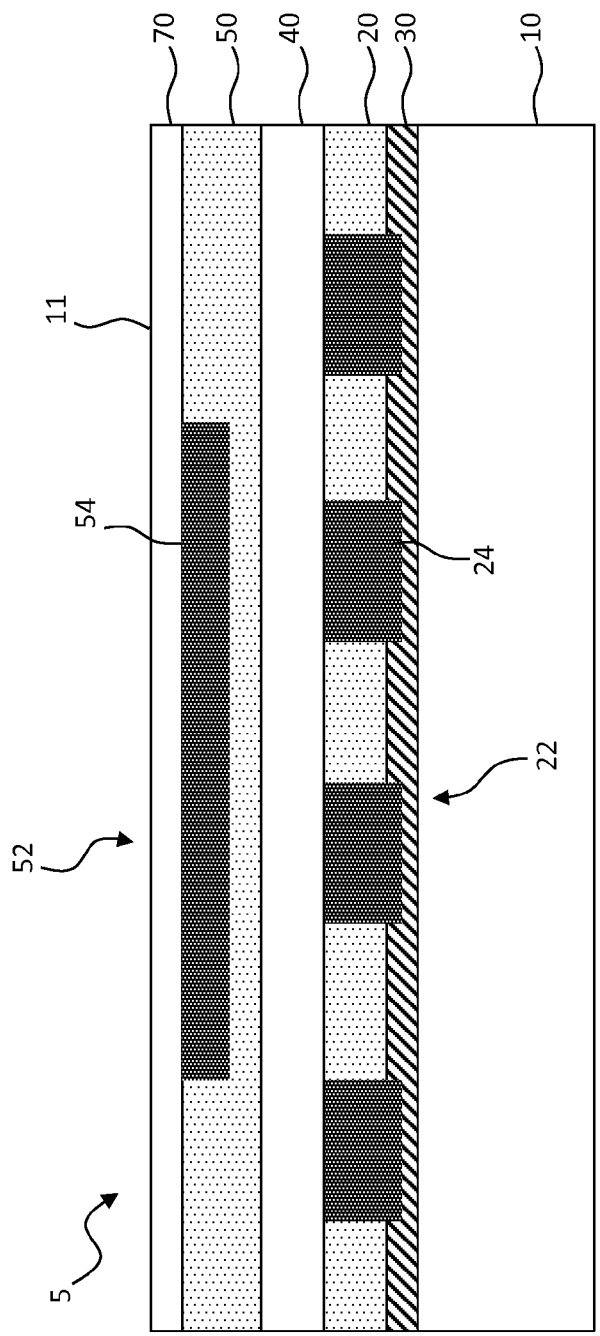
Figure 12:
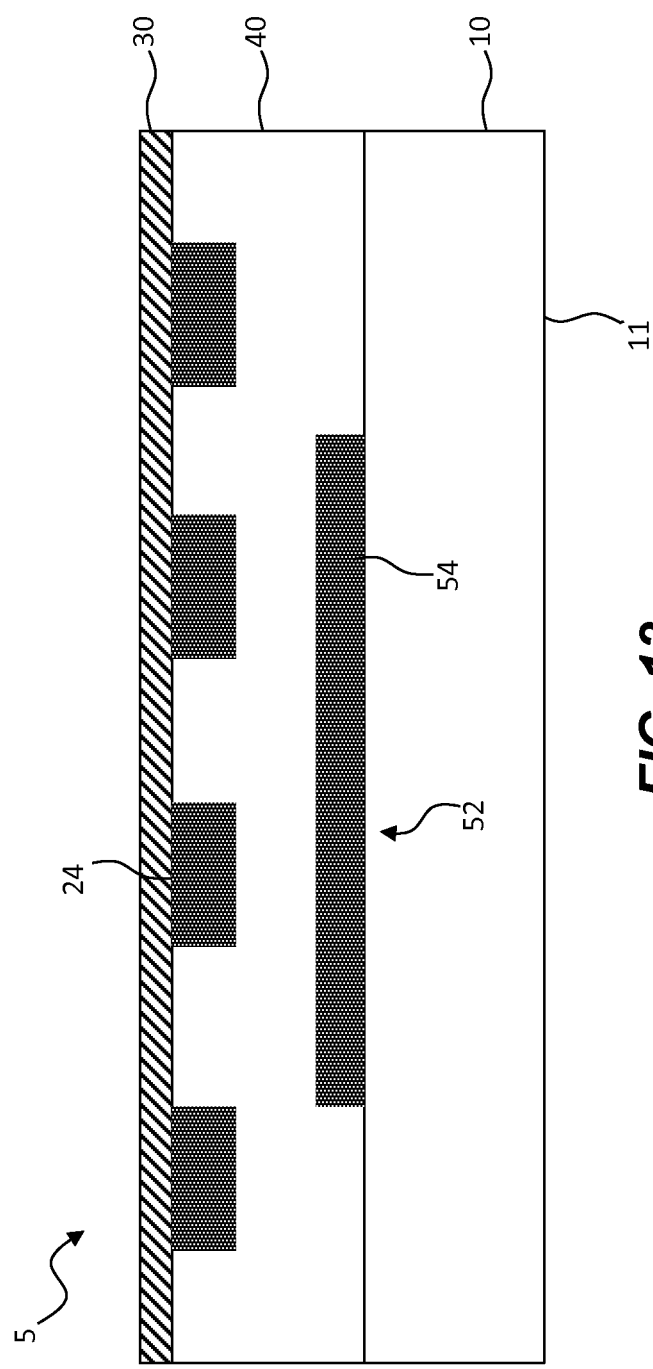

Referring to FIG. 11, driver micro-wires 24 can extend through micro-channels formed in the driver layer 20 into the unpatterned conductive layer 30 to electrically connect the driver micro-wires 24 to the unpatterned conductive layer 30. In such an embodiment, the unpatterned conductive layer 30 and the driver layer 20 can be coated together, for example with slot or extrusion coating, imprinted together with a stamp having protrusions as deep as or deeper than the depth of driver layer 20. The driver and unpatterned conductive layers 20, 30 are then cured together to form micro-channels that are filled with conductive ink and cured to form driver micro-wires 24 in the driver layer 20 in electrical contact with the unpatterned conductive layer 30. The dielectric layer 40, sensor layer 50 with sensor micro-wires 54, and overcoat layer 70 are formed as described with respect to FIG. 1.

Figure 2:
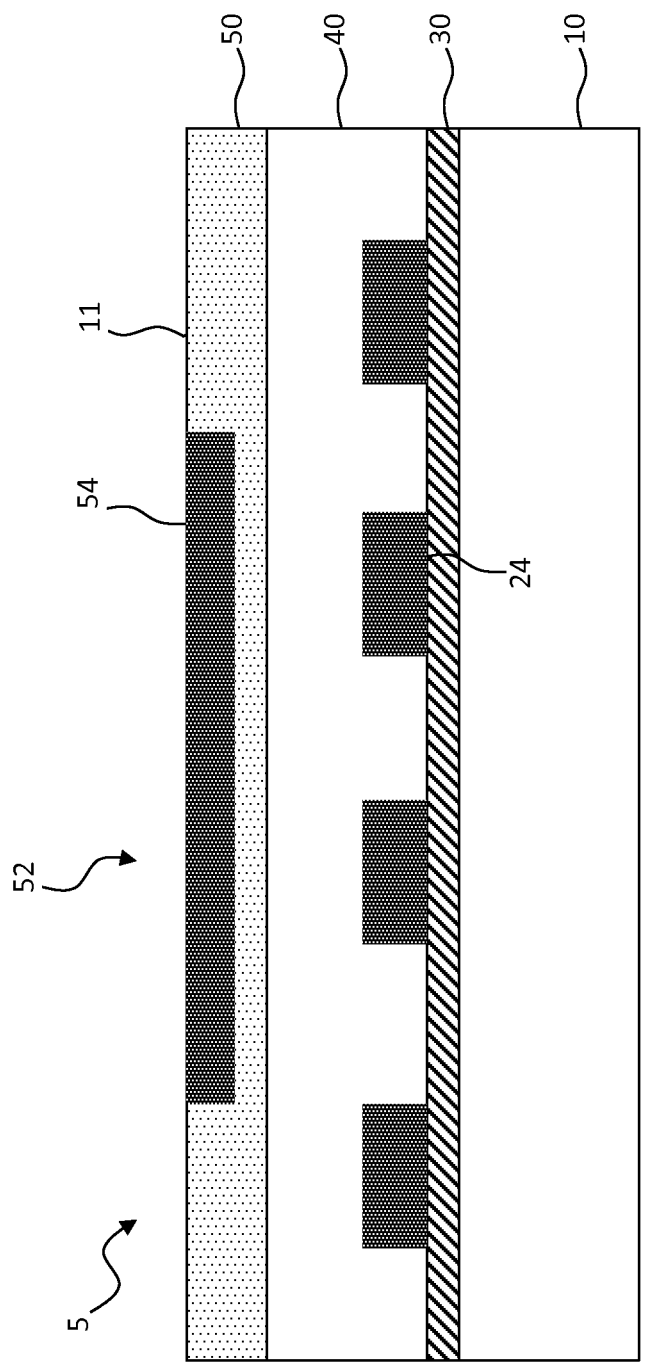
Figure 3:
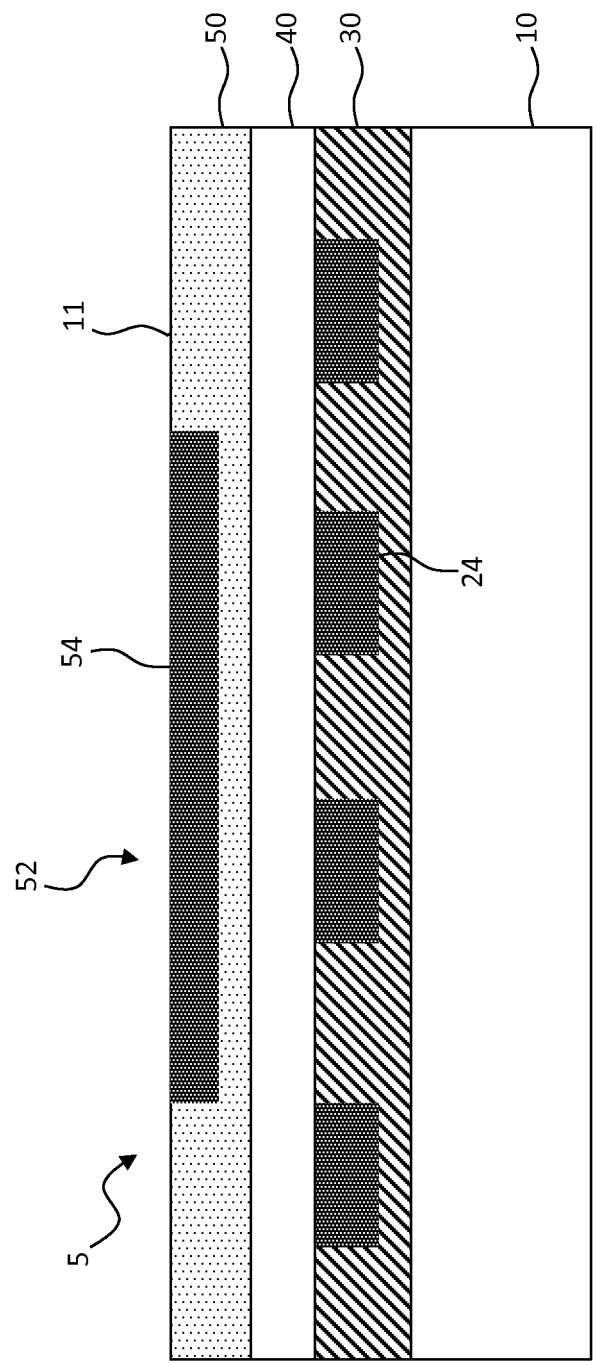
Figure 4:
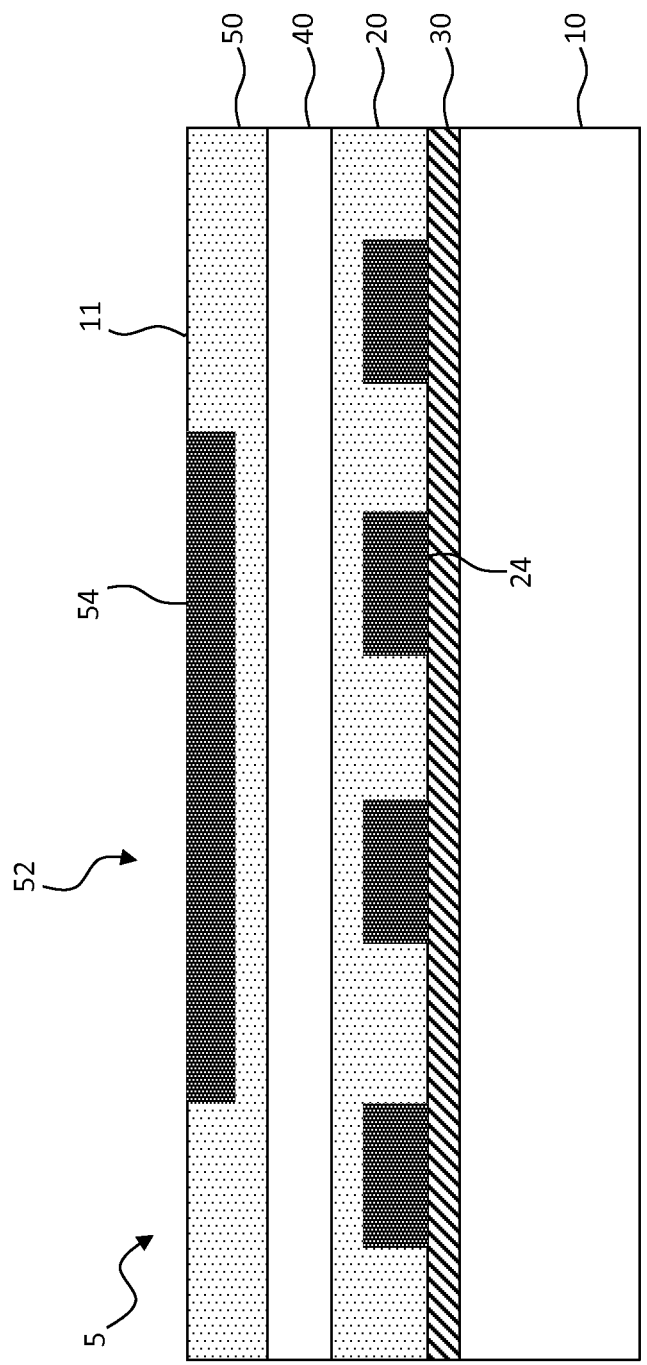

In the second method of first forming micro-wires and then coating over the micro-wires and as shown in the example of FIG. 2, the driver micro-wires 24 are printed or otherwise transferred on the unpatterned conductive layer 30 and then the dielectric layer 40 is provided, for example by coating or laminating, over the driver micro-wires 24. In FIG. 4, the driver micro-wires 24 are printed or otherwise transferred on the unpatterned conductive layer 30 and then the driver layer 20 is provided, for example by coating, on the driver micro-wires 24. In FIG. 5, the driver micro-wires 24 are printed or otherwise transferred on the substrate 10 and then the unpatterned conductive layer 30 is provided. Also as shown in FIG. 5, the sensor micro-wires 54 are printed or transferred on the dielectric layer 40; no separate sensor layer 50 is formed, although an overcoat layer 70 (not shown) can be provided and can serve as a sensor layer 50, if desired.

In all these various embodiments, the various layers can alternatively be pre-made and laminated together. Optically clear adhesives can be used as can conductive adhesives, if desired, for example to electrically connect the unpatterned conductive layer 30 to the driver micro-wires 24. In such an embodiment, the conductive adhesive is considered to be part of the unpatterned conductive layer 30.

In an embodiment of the present invention, the electrical resistance of the unpatterned conductive layer 30 is greater than the resistance of each of the driver electrodes 22. The resistance of the unpatterned conductive layer 30 was measured as the sheet resistance of the unpatterned conductive layer 30 independently of the driver micro-wires 24. The resistance of the driver electrodes 22 is the resistance measured along the length of the driver electrode 22.

In an embodiment, the unpatterned conductive layer 30 has a sheet resistance greater than 1 k$\Omega$ per square, greater than 10 k$\Omega$ per square, greater than 100 k$\Omega$ per square, greater than 1 M$\Omega$ per square, greater than 10 M$\Omega$ per square, greater than 100 M$\Omega$ per square, greater than 1 G$\Omega$ per square, greater than 10 G$\Omega$ per square, or greater than 100 G$\Omega$ per square. This lower limit in resistivity of the unpatterned conductive layer 30 is dependent in part on the frequency at which the driver electrodes 22 are driven and on the driver current and voltage characteristics and on the conductivity of the driver electrodes 22.

In another embodiment, the resistance of the unpatterned conductive layer 30 between any two driver electrodes 22 is at least five times greater, at least ten times greater, at least twenty times greater, at least fifty times greater, at least 100 times greater, at least 500 times greater, at least 1,000 times greater, at least 10,000, at least 100,000, or at least 1,000,000 times greater than the resistance of either of the two driver electrodes 22. For example, as illustrated in FIG. 14, the unpatterned conductive layer 30 is in electrical contact with the driver electrodes 22. The driver electrodes 22 are made up of driver micro-wires 24. The sensor electrodes 52, made up of sensor micro-wires 54, are separated from the driver electrodes 22 by the dielectric layer 40 (FIG. 13, not shown in the plan view of FIG. 14). The driver electrodes 22 are arranged in an array and separated by a gap 60. The sensor electrodes 52 are arranged in an array orthogonal to the array of driver electrodes 22. Thus, in this example, the resistance of the unpatterned conductive layer 30 between driver electrodes 22 separated by the gap 60 is at least ten times greater than the resistance of any of the driver electrodes 22.

In a further embodiment of the present invention, a driver, for example an integrated circuit, for driving the driver electrodes 22 provides voltage and current to the driver electrodes 22 in a desired driver waveform having a period and frequency. The frequency of the driver waveform limits the rate at which the capacitance between the driver and sensor electrodes 22, 52 can be measured. Because the unpatterned conductive layer 30 is electrically connected to the driver electrode 22 and has a limited conductivity, the rate at which the driver electrode 22 and the unpatterned conductive layer 30 can be charged is likewise limited. A micro-wire electrode, such as the driver electrode 22, has open areas between the micro-wires in the micro-wire electrode that, according to the present invention, are filled with conductive material in the unpatterned conductive layer 30. Thus, the conductivity of the unpatterned conductive layer 30 will define, in combination with the open area defined by the geometry of the driver micro-wires 24 in the driver electrode 22, the rate at which the driver electrode 22 and the unpatterned conductive layer 30 can be charged or discharged. Therefore, the conductivity of the unpatterned conductive layer 30 and the open area define the time constant for charging or discharging the driver electrode 22 and the center of the open area in response to a voltage change as provided by the driver waveform. Therefore, according to the further embodiment of the present invention, the sheet resistance of the unpatterned conductive layer 30 is sufficiently low that the time constant for charging the center of the open area between driver micro-wires 24 in the driver electrode 22 is less than the period of a driver waveform. In another embodiment, the time constant is substantially less than the period. By substantially less is meant at least 5% less, at least 10% less, at least 20% less, or at least 50% less.

In operation, a touch-screen controller (for example touch-screen controller 140 of FIG. 13) energizes one of the driver electrodes 22 and senses one of the sensor electrode 52 to detect the capacitance or changes in capacitance of the area overlapped by the one driver electrode 22 and one sensor electrode 52. Since the unpatterned conductive layer 30 electrically connects the driver electrodes 22, some current leaks from the driven driver electrode 22 to other driver electrodes 22. However, because the resistance of the unpatterned conductive layer 30 is high relative to the resistance of the driver electrodes 22, capacitance is still detected in the overlapped electrode area. Moreover, the presence of the unpatterned conductive layer 30 inhibits electromagnetic interference from affecting the capacitance measure by the sensor electrode 52, especially if the electromagnetic interference originates from a side of the unpatterned conductive layer 30 opposite the sensor electrodes 52. Furthermore, the unpatterned conductive layer 30 assists in extending the electrical field produced by driving the driver micro-wires 24 in the one driver electrode 22 into the spaces between the driver micro-wires 24, thereby providing a more uniform field between the driver electrode 22 and the sensor electrode 52. A more uniform field enables a more consistent and sensitive detection of capacitance changes due to the presence of perturbing elements such as a finger or a stylus at varying spatial locations. Furthermore, the presence of the unpatterned conductive layer 30 reduces the sensitivity of the touch-screen device to differences in alignment between the micro-wires of the driver electrodes 22 and the sensor electrodes 52.

In comparison to other prior-art solutions using a separate ground plane beneath driver electrodes to reduce the effect of electro-magnetic radiation, for example from a display located beneath the touch screen, the present invention provides a thinner touch-screen and display structure.

Figure 15:
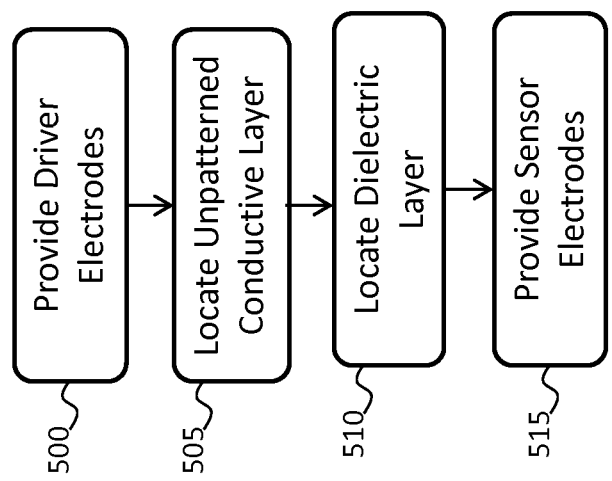
FIG. 15 is a flow diagram illustrating the construction of an embodiment of the present invention.

Referring to FIG. 15, a method of the present invention includes providing a plurality of patterned driver electrodes 22 in step 500, for example on the substrate 10, each driver electrode 22 including a plurality of patterned conductive electrically connected micro-wires 24. The unpatterned conductive layer 30 is located in electrical contact with the driver electrodes 22 in step 505. The dielectric layer 40 is located adjacent to the unpatterned conductive layer 30 in step 510. A plurality of patterned sensor electrodes 52, each sensor electrode 52 including a plurality of patterned conductive electrically connected micro-wires 54 is located over the dielectric layer 40 so that the dielectric layer 40 is located between the driver electrodes 22 and the sensor electrodes 52 in step 515.

A variety of techniques are usable to construct a touch screen device of the present invention. In various embodiments, the patterned driver electrodes 22 are formed in a layer, such as driver layer 20, unpatterned conductive layer 30, or dielectric layer 40, printed or transferred onto a layer, such as the substrate 10, unpatterned conductive layer 30, or dielectric layer 40, or laminated on the substrate 10 or other layer on the substrate 10. In other embodiments, the unpatterned conductive layer 30 is laminated, coated, formed by evaporation, sputtering, or chemical vapor deposition, or formed by atomic layer deposition on the driver electrodes 22 or driver layer 20. The dielectric layer 40 is laminated, coated, formed by evaporation, sputtering, or chemical vapor deposition, or formed by atomic layer deposition on the unpatterned conductive layer 30. The patterned sensor electrodes 52 are formed in a layer, such as sensor layer 50 or dielectric layer 40, printed or transferred onto a layer, such as the substrate 10 or dielectric layer 40, or laminated on the substrate 10 or other layer on the substrate 10.

In an embodiment, unpatterned conductive layer 30 or dielectric layer 40 is deposited by sputtering or deposition and patterned outside the touch-sensitive area 31 either with masks or by photolithographic processes. In an embodiment, conductive material is only deposited in the touch-sensitive area 31. Alternatively, conductive material is deposited over the entire substrate 10 and removed as needed, for example in peripheral regions of the touch screen outside the touch-sensitive area 31. In another embodiment, atomic layer deposition methods are used to form a transparent conductive layer, for example a patterned aluminum zinc oxide layer using methods known in the art. Patterning outside the touch-sensitive area 31 is accomplished, for example, by masking the deposition, using patterned deposition inhibitors, or by photolithographic processes.

Figure 16:
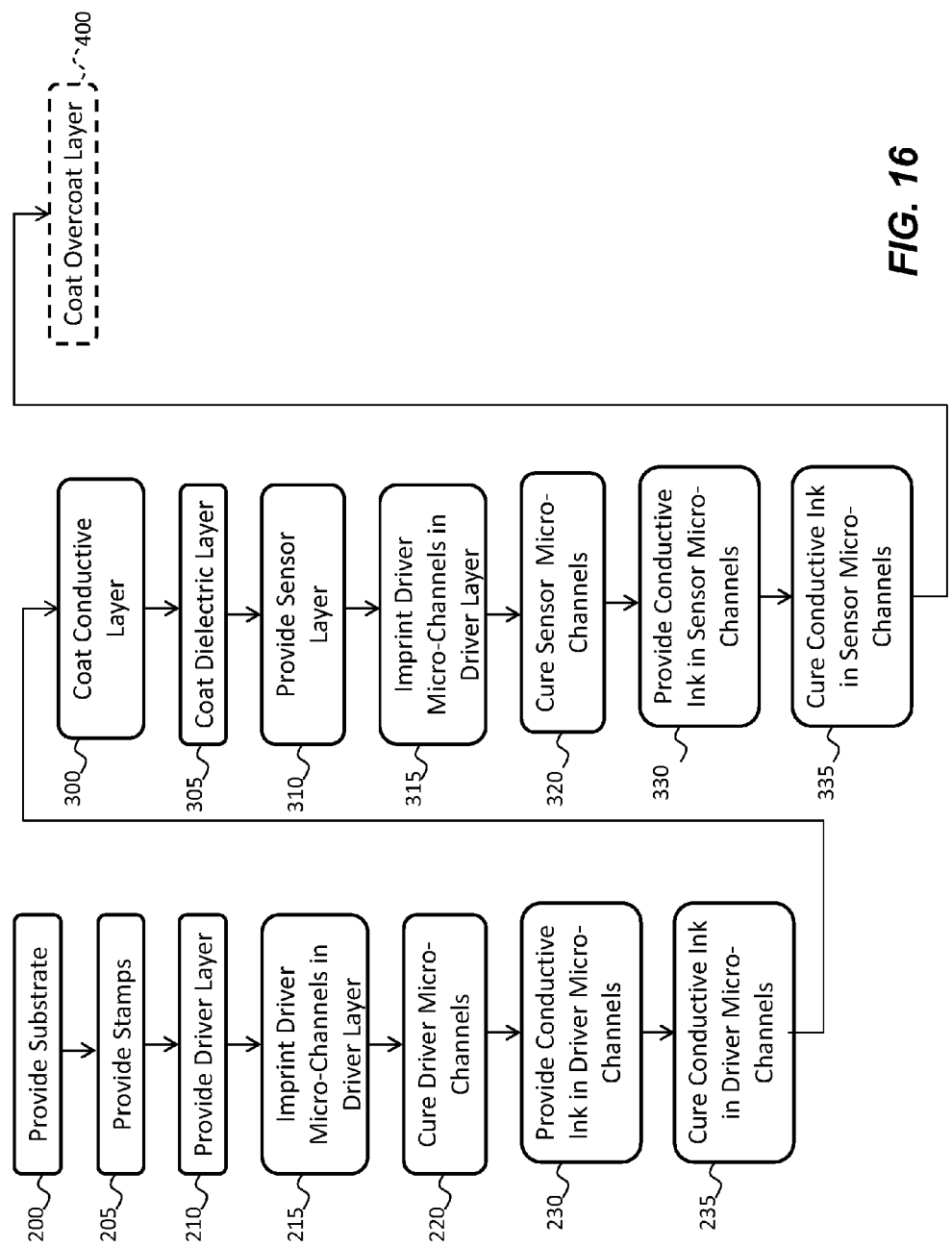
FIG. 16 is a flow diagram illustrating the construction of an embodiment of the present invention.

Alternatively, referring to FIG. 16, the substrate 10 is provided in step 200, together with imprinting stamps in step 205. The driver layer 20 is provided on the substrate 10, for example by coating in step 210. The patterned driver electrodes 22 are formed by imprinting the driver layer 20 with an imprinting stamp in step 215, curing the driver layer 20 to form driver micro-channels in step 220 that are filled with conductive ink in step 230. The conductive ink is cured in step 235 to form driver micro-wires 22. The unpatterned conductive layer 30 is coated over the driver micro-wires 22 in step 300 and the dielectric layer 40 is coated over the unpatterned conductive layer 30 in step 305. The driver layer 20 is provided on the substrate 10, for example by coating in step 310. The patterned sensor electrodes 52 are formed by imprinting the sensor layer 50 with an imprinting stamp in step 315, curing the sensor layer 50 to form sensor micro-channels in step 320 that are filled with conductive ink in step 330. The conductive ink is cured in step 335 to form sensor micro-wires 54. The overcoat layer 70 is optionally coated in step 400.

In other embodiments, imprinting methods are used to imprint driver micro-channels in the dielectric layer 40 (as shown in FIG. 7) or in the unpatterned conductive layer 30 (as shown in FIG. 4). Similarly, in other embodiments imprinting methods are used to imprint sensor micro-channels in the dielectric layer 40 (as shown in FIG. 6).

Printing methods are usable in other embodiments of the present invention. A conductive ink is printable, for example with a flexographic plate, on a substrate 10 or other layer and cured to form micro-wires. Alternatively, a pattern of micro-wires is transferrable to the substrate 10 or other layer. For example, in FIGS. 2 and 4, driver micro-wires 24 are printed or transferred onto the unpatterned conductive layer 30. Referring to FIG. 5, driver micro-wires 24 are printed on or transferred to the substrate 10 and then coated with unpatterned conductive layer 30. Likewise, as shown in FIG. 9, the sensor electrodes 54 are printed on or transferred to the dielectric layer 40 and then coated with the sensor layer 50.

In an alternative embodiment, micro-wires are formed by coating a flexographic substrate having a raised pattern corresponding to a desired micro-wire pattern with a conductive ink. The flexographic substrate is brought into contact with a layer surface to print the conductive ink onto the layer surface. In an optional step, the conductive ink is dried. Flexographic substrates are known in the flexographic printing arts.

In yet another embodiment, layer structures are laminated to another layer. Referring to FIG. 1, for example, the driver layer 20 is made as a separate construction (for example as a layer of PET) including driver micro-wires 24 and then laminated with an adhesive to substrate 10. Sensor layer 50 is made and similarly laminated. The unpatterned conductive layer 30 or dielectric layer 40 can be laminated onto their respective layers, together or separately. In another embodiment, a layer structure is formed on a temporary substrate with a temporary adhesive on a first side, the layer structure is permanently adhered to the substrate 10 or layer formed on the substrate 10 on a second side, and then the temporary substrate is removed from the first side, for example by peeling.

In various embodiments, the unpatterned conductive layer 30 is laminated, coated, or deposited on the driver electrodes 22. In an embodiment, atomic layer deposition is used to form the unpatterned conductive layer 30. In other embodiments, the dielectric layer 40 is laminated, coated, or deposited on the driver electrodes 22.

Dielectric layer 40 can be any of many known dielectric materials included polymers or oxides and are deposited or formed in any of a variety of known ways, including pattern-wise inkjet deposition, sputter or coating through a mask or blanket coated and patterned using known photo-lithographic methods. Such known photo-lithographic technology can include a photo-sensitive material that is optically patterned through a mask to cure the photo-sensitive material and removal of uncured material.

In an embodiment, unpatterned conductive layer 30 is transparent and includes one or more of a variety of transparent conductive materials, for example organic conductive polymers such as Poly(3,4-ethylenedioxythiophene) (PEDOT), Poly(3,4-ethylenedioxythiophene) PEDOT: poly(styrene sulfonate) PSS, Poly(4,4-dioctylcyclopentadithiophene), and Polypyrrole (PPy), long-chain aliphatic amines (optionally ethoxylated) and amides, quaternary ammonium salts (such as, behentrimonium chloride or cocamidopropyl betaine), esters of phosphoric acid, polyethylene glycol esters, or polyols, polyaniline nanofibers, carbon nanotubes, graphene, metals such as silver nanowires, and inorganic conductive oxides such as ITO, $SnO_2$, $In_2O_3$, ZnO, Aluminum-doped zinc oxide (AZO), CdO, $Ga_2O_3$, $V_2O_5$. Deposition methods for conductive materials can include solvent or aqueous coating, printing by for example inkjet, gravure, offset litho, flexographic, or electro-photographic, lamination, evaporation, chemical vapor deposition (CVD), sputtering, atomic-layer deposition (ALD) or spatial-atomic-layer deposition (SALD).

In another embodiment, conductive layer 30 is an ionic conductor, a solid ionic conductor, an electrolyte, a solid electrolyte, or a conductive gel, as are known in the art.

In an embodiment, the unpatterned conductive layer 30 has a thickness less than or equal to 50 nm, 100 nm, 200 nm, 500 nm, or 1 micron. In other embodiments, the unpatterned conductive layer 30 has a thickness less than or equal to 10 microns, 100 microns, 200 microns, 500 microns, or 1 mm.

According to various embodiments of the present invention, the substrate 10 is any material on which a layer is formed. The substrate 10 is a rigid or a flexible substrate made of, for example, a glass, metal, plastic, or polymer material, can be transparent, and can have opposing substantially parallel and extensive surfaces. Substrates 10 can include a dielectric material useful for capacitive touch screens and can have a wide variety of thicknesses, for example 10 microns, 50 microns, 100 microns, 1 mm, or more. In various embodiments of the present invention, substrates 10 are provided as a separate structure or are coated on another underlying substrate, for example by coating a polymer substrate layer on an underlying glass substrate.

In various embodiments substrate 10 is an element of other devices, for example the cover or substrate of a display or a substrate, cover, or dielectric layer of a touch screen. In an embodiment, the substrate 10 of the present invention is large enough for a user to directly interact therewith, for example using an implement such as a stylus or using a finger or hand. Methods are known in the art for providing suitable surfaces on which to coat or otherwise form layers. In a useful embodiment, the substrate 10 is substantially transparent, for example having a transparency of greater than 90%, 80% 70% or 50% in the visible range of electromagnetic radiation.

Electrically conductive micro-wires and methods of the present invention are useful for making electrical conductors and busses for transparent micro-wire electrodes and electrical conductors in general, for example as used in electrical busses. A variety of micro-wire patterns are used and the present invention is not limited to any one pattern. Micro-wires can be spaced apart, form separate electrical conductors, or intersect to form a mesh electrical conductor on, in, or above the substrate 10. Micro-channels can be identical or have different sizes, aspect ratios, or shapes. Similarly, micro-wires can be identical or have different sizes, aspect ratios, or shapes. Micro-wires can be straight or curved.

A micro-channel is a groove, trench, or channel formed on or in a layer extending from the surface of the layer and having a cross-sectional width for example less than 20 microns, 10 microns, 5 microns, 4 microns, 3 microns, 2 microns, 1 micron, or 0.5 microns, or less. In an embodiment, the cross-sectional depth of a micro-channel is comparable to its width. Micro-channels can have a rectangular cross section. Other cross-sectional shapes, for example trapezoids, are known and are included in the present invention. The width or depth of a layer is measured in cross section. Micro-channels are not distinguished in the Figures from the micro-wires.

Imprinted layers useful in the present invention can include a cured polymer material with cross-linking agents that are sensitive to heat or radiation, for example infra-red, visible light, or ultra-violet radiation. The polymer material is a curable material applied in a liquid form that hardens when the cross-linking agents are activated. When a molding device, such as an imprinting stamp having an inverse micro-channel structure is applied to liquid curable material and the cross-linking agents in the curable material are activated, the liquid curable material in the curable layer is hardened into a cured layer. The liquid curable materials can include a surfactant to assist in controlling coating. Materials, tools, and methods are known for embossing coated liquid curable materials to form cured layers.

A cured layer is a layer of curable material that has been cured. For example, a cured layer is formed of a curable material coated or otherwise deposited on a layer surface to form a curable layer and then cured to form the cured layer. The coated curable material is considered herein to be a curable layer before it is cured and cured layer after it is cured. Similarly, a cured electrical conductor is an electrical conductor formed by locating a curable material in micro-channel and curing the curable material to form a micro-wire in a micro-channel. As used herein, curing refers to changing the properties of a material by processing the material in some fashion, for example by heating, drying, irradiating the material, or exposing the material to a chemical, energetic particles, gases, or liquids.

The curable layer is deposited as a single layer in a single step using coating methods known in the art, such as curtain coating. In an alternative embodiment, the curable layer is deposited as multiple sub-layers using multi-layer deposition methods known in the art, such as multi-layer slot coating, repeated curtain coatings, or multi-layer extrusion coating. In yet another embodiment, the curable layer includes multiple sub-layers formed in different, separate steps, for example with a multi-layer extrusion, curtain coating, or slot coating machine as is known in the coating arts.

Curable inks useful in the present invention are known and can include conductive inks having electrically conductive nano-particles, such as silver nano-particles. In an embodiment, the electrically conductive nano-particles are metallic or have an electrically conductive shell. The electrically conductive nano-particles can be silver, can be a silver alloy, or can include silver. In various embodiments, cured inks can include metal particles, for example nano-particles. The metal particles are sintered to form a metallic electrical conductor. The metal nano-particles are silver or a silver alloy or other metals, such as tin, tantalum, titanium, gold, copper, or aluminum, or alloys thereof. Cured inks can include light-absorbing materials such as carbon black, a dye, or a pigment.

Curable inks provided in a liquid form are deposited or located in driver or sensor micro-channels and cured, for example by heating or exposure to radiation such as infra-red, visible light, or ultra-violet radiation. The curable ink hardens to form the cured ink that makes up driver or sensor micro-wires 24, 54. For example, a curable conductive ink with conductive nano-particles are located within driver or sensor micro-channels and cured by heating or sintering to agglomerate or weld the nano-particles together, thereby forming an electrically conductive driver or sensor micro-wire 24, 54. Materials, tools, and methods are known for coating liquid curable inks to form micro-wires.

In an embodiment, a curable ink can include conductive nano-particles in a liquid carrier (for example an aqueous solution including surfactants that reduce flocculation of metal particles, humectants, thickeners, adhesives or other active chemicals). The liquid carrier is located in micro-channels and heated or dried to remove liquid carrier or treated with hydrochloric acid, leaving a porous assemblage of conductive particles that are agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in the micro-wire formation process.

In various embodiments of the present invention, micro-channels or micro-wires have a width less than or equal to 10 microns, 5 microns, 4 microns, 3 microns, 2 microns, or 1 micron. In an example and non-limiting embodiment of the present invention, each micro-wire is from 10 to 15 microns wide, from 5 to 10 microns wide, or from 5 microns to one micron wide. In some embodiments, micro-wires can fill micro-channels; in other embodiments micro-wires do not fill micro-channels. In an embodiment, the micro-wires are solid; in another embodiment, the micro-wires are porous.

Micro-wires can be metal, for example silver, gold, aluminum, nickel, tungsten, titanium, tin, or copper or various metal alloys including, for example silver, gold, aluminum, nickel, tungsten, titanium, tin, or copper. Micro-wires can include a thin metal layer composed of highly conductive metals such as gold, silver, copper, or aluminum. Other conductive metals or materials are usable. Alternatively, micro-wires can include cured or sintered metal particles such as nickel, tungsten, silver, gold, titanium, or tin or alloys such as nickel, tungsten, silver, gold, titanium, or tin. Conductive inks are used to form micro-wires with pattern-wise deposition or pattern-wise formation followed by curing steps. Other materials or methods for forming micro-wires, such as curable ink powders including metallic nano-particles, are employed and are included in the present invention.

Electrically conductive micro-wires of the present invention are operable by electrically connecting micro-wires through connection pads and electrical connectors to electrical circuits that provide electrical current to micro-wires and can control the electrical behavior of micro-wires. Electrically conductive micro-wires of the present invention are useful, for example in touch screens such as projected-capacitive touch screens that use transparent micro-wire electrodes and in displays. Electrically conductive micro-wires can be located in areas other than display areas, for example in the perimeter of the display area of a touch screen, where the display area is the area through which a user views a display.

INVENTIVE EXAMPLE

Figure 17:
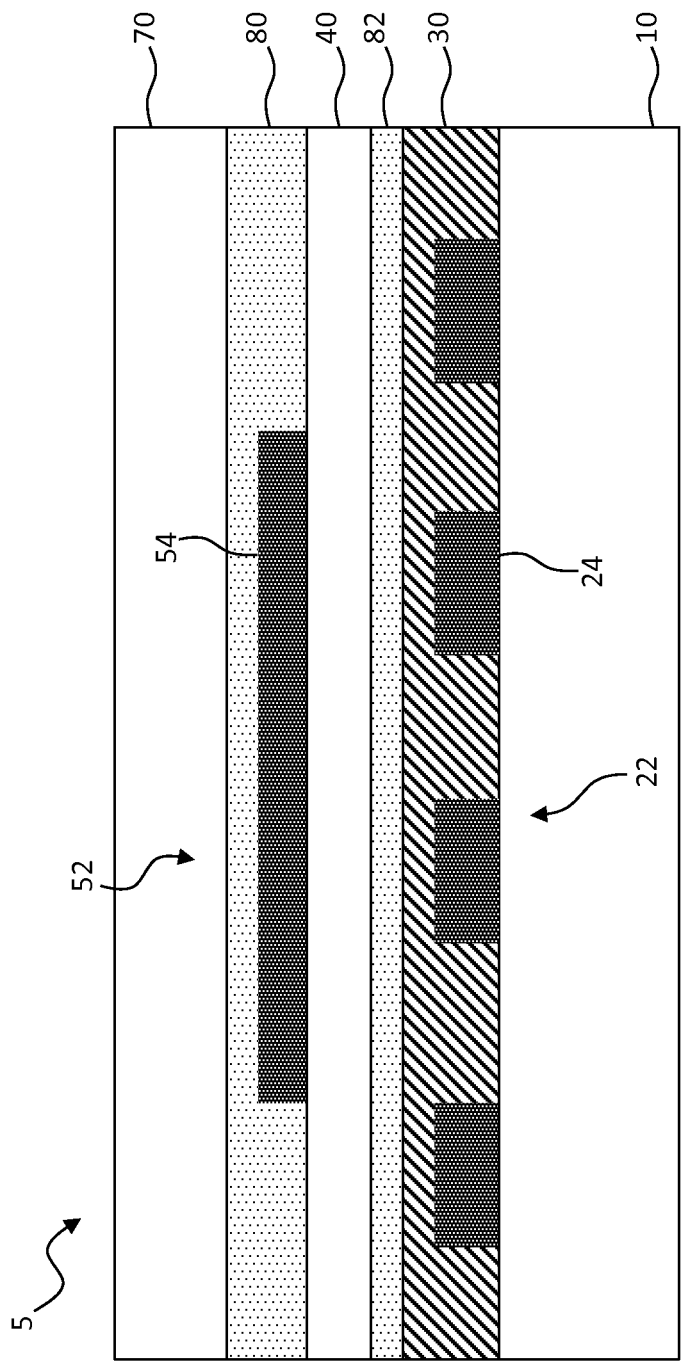
FIG. 17 is a cross sectional view of an experimental sample of an embodiment of the present invention.
Figure 18:
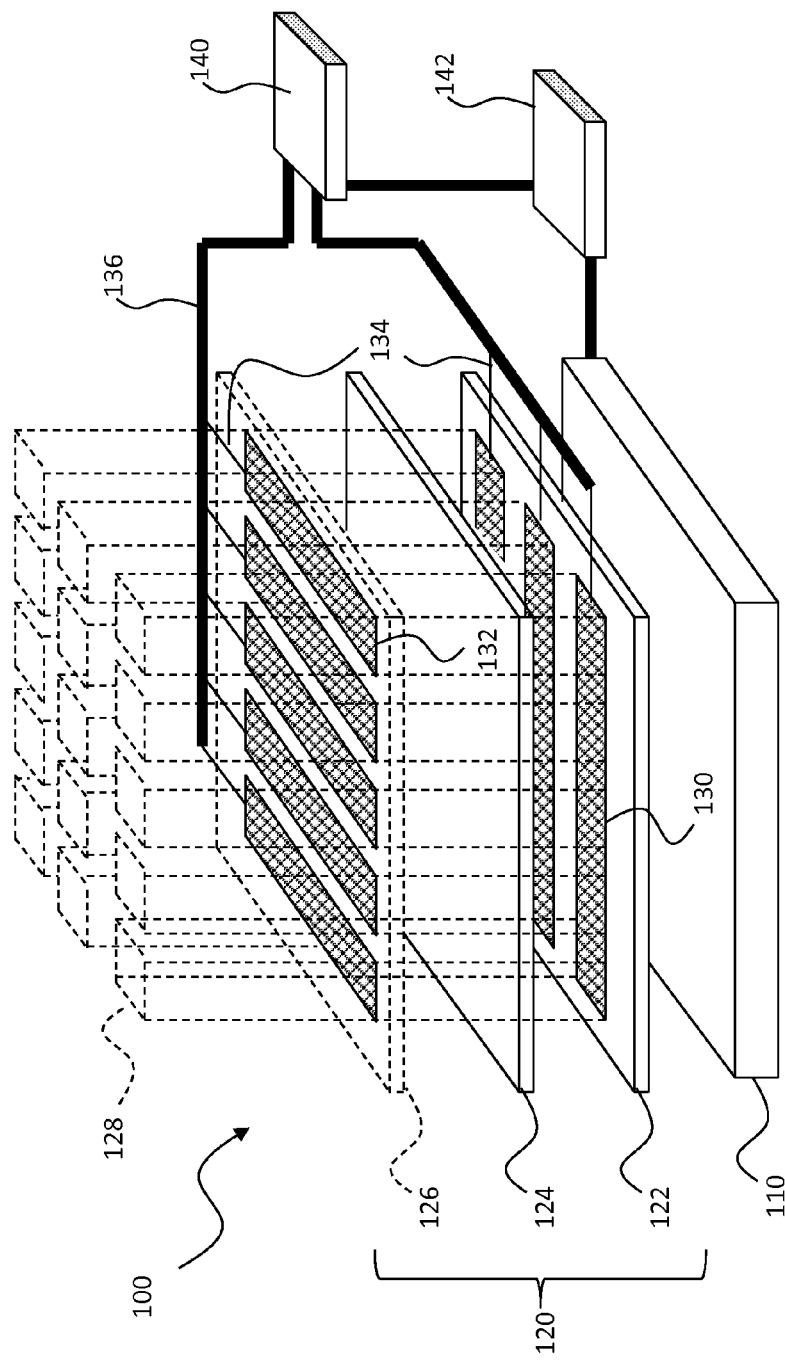
FIG. 18 is a perspective of a touch screen and display apparatus according to the prior art.
Figure 19:
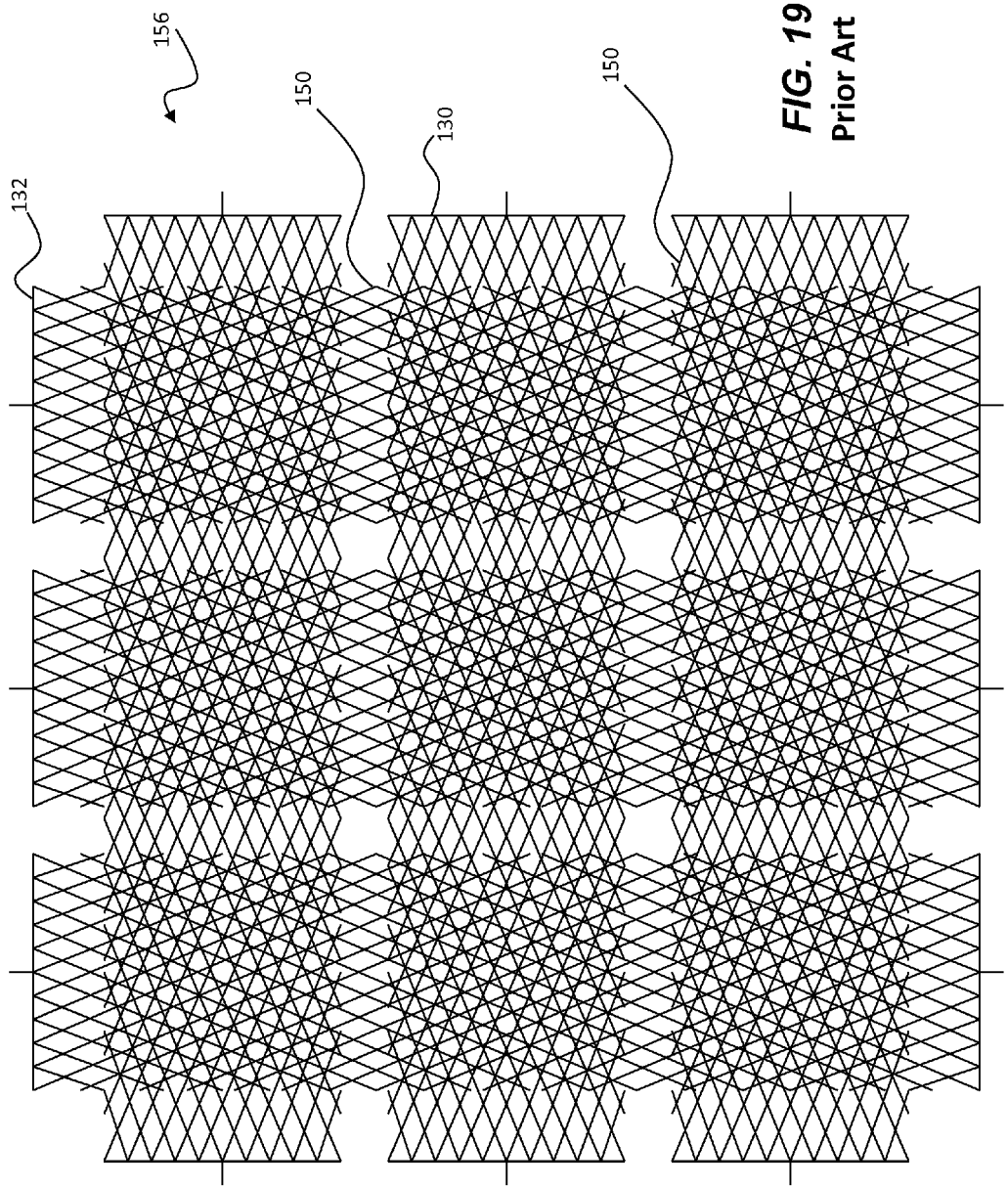
FIG. 19 is a plan view of micro-wire electrodes according to the prior art.

Referring to FIG. 17, sensor electrodes 52 including sensor micro-wires 54 were prepared using a standard lithographic process. Microposit 1813 photoresist was spin-coated onto a 1000 Å thermally deposited aluminum layer coated on a 2.5 inch by 2.5 inch square 4 mil PET support. The photoresist was exposed to UV light through a chrome-on-quartz mask, developed, rinsed and dried. The film was then etched in PAN etch leaving a positive image having 10 μm wide aluminum micro-wires consisting of connected open right-angle-diamond electrodes, 1600 μm on diagonal. The periodic width of the sensor electrodes 52 was 6.42 mm separated by 400 micron breaks in the sensor micro-wires 54 at intersections between sensor electrodes 52. The sensor electrodes 52 were terminated with conductive rectangular pads to enable simple resistance measurements end-to-end. The pads at one end of the sensor electrodes 52 also had conductive buss lines leading to additional pads at the edge of the support (dielectric layer 40) to enable conventional 1 mm pitch edge connection with electrical test fixtures. The photoresist was removed with acetone and methanol baths and dried with nitrogen. Sensor electrode 52 resistance was measured to be on the order of 450Ω from end-to-end and essentially infinite between nearest neighbor electrodes.

Driver electrodes 22 were prepared as were the sensor electrodes 52, on a separate 4 mil PET support (substrate 10), and with the final addition of a transparent unpatterned conductive layer 30 formed on the lithographically patterned micro-wires 24 by spin coating a solution of PEDOT/PSS at 3000 rpm and drying on a hotplate for 2 minutes at 110° C. Sheet resistance of the dried PEDOT/PSS coating on a section of bare PET support using a four point probe was 8 MΩ/square. Driver electrode resistance was measured to be on the order of 450Ω from end-to-end with approximately 160 kΩ between nearest neighbor electrodes. Thus the ratio of shorting resistance to driver resistance in this inventive example was 356 to 1.

A functional touch-screen was fabricated from the prepared sensor and driver electrodes 52, 22 by first, laminating a cover sheet of 4 mil PET (overcoat layer 70) on the exposed side of the sensor electrodes 52 on dielectric layer 40 using optically clear adhesive (first optically clear adhesive layer 80), OCA (Adhesives Research, ARClear 8154 Optically Clear Unsupported Transfer Adhesive) to form a coversheet of the touch-screen example. Sensor electrodes 52 were oriented 90 degrees with respect to driver electrodes 22 and offset such that the intersections of the diamonds were directly above the center of the diamonds of the driver electrodes 22. The uncoated side of the dielectric layer 40 was laminated to the exposed side of the unpatterned conductive layer 30 using the same optically clear adhesive as second optically clear adhesive layer 82. The dielectric thus includes both the OCA (second optically clear adhesive layer 82) and the 4 mil PET dielectric layer 40.

COMPARATIVE EXAMPLE

For the purpose of comparison, a control touch-screen representing an example of the prior art was prepared exactly as described above except the coating of PEDOT/PSS forming the unpatterned conductive layer 30 was eliminated in the comparative example.

Results:

The measurement apparatus consisted of two translation stages which were used to move a mechanical, artificial finger incrementally across the sample. The weight of the finger was used to provide a constant touch force and the tip of the artificial finger consisted of a compliant, conductor loaded polymer foam mounted on the end of a conductive rod. All but one drive electrode 22 were held at ground while a voltage waveform consisting of a controlled burst of sine waves (either 100 kHz or 1 MHz) was applied to one of the drive electrodes 22. All of the sense electrodes 52 were held at ground and one was connected to a charge sensitive pre-amplifier (operational amplifier with capacitor feedback) which held the sense electrodes 52 at ground and output a voltage proportional to the input charge. The output voltage from the sensing amplifier was sampled periodically at 20 MHz. Digital processing was used to synchronously (with respect to the driven waveform) rectify the sampled signal and compute an average (in phase) voltage. By spatially stepping the artificial finger across the sample in a spatial matrix of locations, the sensed voltages are mapped as a function of the artificial finger location. By inference, the response of a single repetitive unit at a single location is the same as the response at any other location (except for boundaries). By measuring a known conventional capacitor with the same instrument, the voltage reading is converted to effective capacitance readings.

The mutual no-touch capacitance for the inventive example was 1.8 times higher than the comparative example at either 100 kHz or 1 MHz. This increase illustrates the effective field-spreading characteristic of the unpatterned conductive layer 30 in the inventive example at practical measurement frequencies and are usable to reduce the relative power consumption of a touch-sensor controller resulting in improved system efficiency.

To test touch sensitivity, the examples were scanned with a 10.4 mm diameter artificial finger in a matrix pattern centered at an intersection of the active sensor and driver electrodes 52, 22. In each case, far from the intersection, the capacitance was equivalent to the no-touch condition, as expected. Centered on the intersection the capacitance was less than the no-touch condition and the relative difference between the near node touch and no-touch reading was taken as a measure of the touch sensitivity.

$$\text{Touch-Sensitivity} = -(C_{touch} - C_{no\_touch})/C_{no\_touch}$$

At 1 MHz the relative touch sensitivity was 42% for the inventive example and 50% for the comparative example. Thus, the touch signal in the inventive example was strong and differences between the inventive and comparative example small, demonstrating that the unpatterned conductive layer 30 has minimal effect on the touch sensitivity while increasing the capacitance. The observed difference in touch sensitivity can be due in part or entirely to imperfections of the alignment of sensor and driver electrodes in each example.

To test the shielding properties, connections to the sensor and driver electrodes 52, 22 were exchanged thus reversing the roles of the driver and sensor electrodes 22, 52 and the artificial finger was scanned over the back-side of the examples. By symmetry this makes no difference for the comparative example but shows a reduction in touch sensitivity due to the shielding effects of the field-spreading unpatterned conductive layer 30 in the inventive example. Indeed, the results showed a factor of 3 reductions in touch sensitivity at 1 MHz and complete elimination of touch signal at 100 kHz for the inventive example. This reduction in frequency response is an illustration of the time constant for charging or discharging the open areas of the unpatterned conductive layer 30 in the driver electrode 22. Touch sensitivity of the comparative example was unaffected, as expected. Thus the field spreading unpatterned conductive layer 30 in the inventive example exhibited highly effective shielding at practical frequencies with no deleterious effects due to shorting between driver electrodes 22. Capacitance signal increased and little change in touch sensitivity was observed when driven and sensed in the intended configuration achieving a considerable improvement in overall system efficiency relative to the prior art example was demonstrated.

Methods and devices for forming and providing substrates and coating substrates are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are well known. These tools and methods are usefully employed to design, implement, construct, and operate the present invention. Methods, tools, and devices for operating capacitive touch screens are used with the present invention.

In addition to the inventive and comparative examples described, a touch-screen structure of the present invention having a PEDOT/PSS unpatterned conductive layer 30 was constructed using the imprinting techniques described and, in a separate sample, an unpatterned conductive layer 30 of AZO on etched driver micro-wires 24 was formed using atomic-layer deposition methods.

Driver or sensor electrodes 22, 52 can be formed in a variety of patterns. Electrodes can be rectangular and arranged in regular arrays. Driver electrodes 22 and sensor electrodes 52 can be arranged orthogonally to each other. Alternatively, electrodes can be arranged using polar coordinates, in circles, or in other curvilinear patterns. Electrodes can have uniform spacing or widths. Alternatively, electrodes can have non-uniform spacing and variable widths.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch-screen devices such as capacitive touch screen devices.

The invention has been described in detail with particular reference to certain embodiments thereof, but it will be understood that variations and modifications can be effected within the spirit and scope of the invention.

PARTS LIST

5 touch-screen device
10 substrate 11 touch surface
20 driver layer
22 driver electrode
24 driver micro-wire
30 unpatterned conductive layer/touch sensitive area
31 touch-sensitive area
32 conductive-material layer
40 dielectric layer
50 sensor layer
52 sensor electrode
54 sensor micro-wire
60 gap
70 overcoat layer
80 first optically clear adhesive layer
82 second optically clear adhesive layer
100 display and touch-screen apparatus
110 display
120 touch screen
122 first transparent substrate
124 dielectric layer
126 second transparent substrate
128 touch pad area
130 first transparent electrode
132 second transparent electrode
134 wires
136 electrical buss connections
140 touch-screen controller
142 display controller
150 micro-wire
156 micro-pattern
200 provide substrate step
205 provide stamps step
210 provide driver layer step
215 imprint driver micro-channels step
220 cure driver micro-channels step
230 provide conductive ink in driver micro-channels step
235 cure conductive ink in driver micro-channels step
300 coat conductive layer step
305 coat dielectric layer step
310 provide sensor layer step
315 imprint sensor micro-channels step
320 cure sensor micro-channels step
330 provide conductive ink in sensor micro-channels step
335 cure conductive ink in sensor micro-channels step
400 optional coat overcoat step
500 provide driver electrodes step
505 locate unpatterned conductive layer step
510 locate dielectric layer step
515 provide sensor electrodes step

The invention claimed is:

1. A touch-screen device having a touch-sensitive area, comprising:
   a plurality of patterned driver electrodes in the touch-sensitive area, each driver electrode including a plurality of patterned conductive electrically connected driver micro-wires;
   a conductive layer that is unpatterned in the touch-sensitive area, the conductive layer in electrical contact with the driver micro-wires of the driver electrodes;
   a plurality of patterned sensor electrodes in the touch-sensitive area, each sensor electrode including a plurality of patterned conductive electrically connected sensor micro-wires;
   a dielectric layer located between the driver electrodes and the sensor electrodes; and
   a driver waveform having a period, and wherein the sheet resistance of the unpatterned conductive layer is sufficiently low that the time constant for charging or discharging the center of the open area between driver micro-wires in the driver electrode area is less than the period of the driver waveform.

2. The touch-screen device of claim 1, wherein the unpatterned conductive layer is between the driver electrodes and the dielectric layer.

3. The touch-screen device of claim 1, wherein the driver electrodes are between the unpatterned conductive layer and the dielectric layer.

4. The touch-screen device of claim 1, wherein the driver electrodes are formed in the unpatterned conductive layer.

5. The touch-screen device of claim 1, further including a substrate.

6. The touch-screen device of claim 5, wherein the driver electrodes are located between the substrate and the dielectric layer.

7. The touch-screen device of claim 5, wherein the sensor electrodes are located between the substrate and the dielectric layer.

8. The touch-screen device of claim 5, wherein the substrate is the dielectric layer.

9. The touch-screen device of claim 1, wherein the resistance of the unpatterned conductive layer between any two driver electrodes is at least ten times greater than the resistance of the any two driver electrodes.

10. The touch-screen device of claim 1, wherein the unpatterned conductive layer has a sheet resistance greater than about 1 kohm/square, greater than about 10 kohm/square, or greater than about 100 kohm/square.

11. The touch-screen device of claim 1, wherein the unpatterned conductive layer has a sheet resistance greater than about 1 Mohm/square, 10 Mohm/square, 100 Mohm/square, or 1 Gohm/square.

12. The touch-screen device of claim 1, wherein the driver or sensor micro-wires are formed in imprinted micro-channels.

13. The touch-screen device of claim 1, wherein the driver or sensor micro-wires are formed in the dielectric layer.

14. The touch-screen device of claim 1, wherein the driver micro-wires are formed in the unpatterned conductive layer.

15. The touch-screen device of claim 14, wherein the micro-channels extend through the driver layer into the unpatterned conductive layer.

16. The touch-screen device of claim 1, further including a driver layer and wherein the micro-wires extend into the driver layer.

17. The touch-screen device of claim 1, wherein the unpatterned conductive layer includes one or more of polyethylene dioxythiophene, oxides, vanadium pentoxide, tin oxide, indium tin oxide, or aluminum, zinc oxide, zinc oxide, or combinations thereof.

18. The touch-screen device of claim 1, wherein the unpatterned conductive layer has a thickness less than 200 nm.

* * * * *